United States Patent
Mitlin et al.

(10) Patent No.: US 7,758,708 B2
(45) Date of Patent: Jul. 20, 2010

(54) NANOCOMPOSITE FILMS

(75) Inventors: David Mitlin, Edmonton (CA); Colin Ophus, Edmonton (CA); Stephane Evoy, Edmonton (CA); Velimir Radmilovic, Piedmont, CA (US); Reza Mohammadi, Edmonton (CA); Ken Westra, Edmonton (CA); Nathaniel Nelson-Fitzpatrick, Edmonton (CA); Zonghoon Lee, Albany, CA (US)

(73) Assignees: The Governors of the University of Alberta, Edmonton, Alberta (CA); The University of California, Oakland, CA (US)

( * ) Notice: Subject to any disclaimer, the term of this patent is extended or adjusted under 35 U.S.C. 154(b) by 315 days.

(21) Appl. No.: 11/831,434

(22) Filed: Jul. 31, 2007

(65) Prior Publication Data

US 2008/0171219 A1    Jul. 17, 2008

Related U.S. Application Data

(60) Provisional application No. 60/853,305, filed on Jul. 31, 2006.

(51) Int. Cl.
  *C22C 45/10* (2006.01)
  *C22C 27/04* (2006.01)
(52) U.S. Cl. .................. 148/403; 148/423; 204/192.15; 438/694; 977/732; 977/810
(58) Field of Classification Search .................. 148/403
  See application file for complete search history.

(56) References Cited

U.S. PATENT DOCUMENTS 5,252,144 A * 10/1993 Martis .................. 148/121
5,340,413 A *  8/1994 Martis .................. 148/305
5,419,789 A *  5/1995 Kita ..................... 148/437

OTHER PUBLICATIONS

Massalski, T.B. ed. 1990 "Binary Phase Diagrams" vol. 1 (Materials Park, Ohio, ASM International 173.
F.R. de Boer, et al. "Cohesion in Metals—Transition Metal Alloys", Elsevier Scientific Pub. Co. NY USA 1988.
Massalski, T.B. ed "Binary Alloy Phase Diagrams", vol. 2, ASM Int'l. Materials Park, Ohio, 2nd Ed., 1990.
Kaye, G. et al. 1993 "Tables of Physical and Chemical Constants" 15th ed. (London, UK: Longman).
Cleland, A.N., et al. "Fabrication of High Frequency Nanometer scale mechanical resonators from bulk Si crystals", Applied Physics Letter 69; pp: 2653-2655, Oct. 1996.
Carr, Dustin W., et al. "Measurement of mechanical resonance and losses in nanometer scale silicon wires", 1999 American Institute of Physics; pp: 920-922.
Sekaric, L., et al. "Nanomechanical resonant structures in silicon nitride: fabrication, operation and dissipation issues", 2002 Elsevier Science B.V., pp. 215-219.

(Continued)

*Primary Examiner*—George Wyszomierski
(74) *Attorney, Agent, or Firm*—Bennett Jones LLP

(57) ABSTRACT

A thin-film composition of nanocrystal molybdenum in an amorphous metallic matrix may be formed by co-sputtering Mo with aluminum or nickel. NEMS cantilevers may be formed from the film. The films exhibit high nanoindentation hardness and a reduction in roughness and intrinsic stress, while maintaining resistivity in the metallic range.

15 Claims, 14 Drawing Sheets

OTHER PUBLICATIONS

Fu, Yongqing, et al. "TiNi-based thin films in MEMS applications: a review", 2004 Elsevier B.V., pp. 395-408.

Ekinci, K.L., et al. "Nanoelectromechanical systems", Review of Scientific Instruments, 2005 American Institute of Physics, pp. 061101-1 to 061101-12.

Mehregany, Mehran, et al. "Silicon Carbide MEMS for Harsh Environments", Proceedings of the IEEE, vol. 86, No. 8, Aug. 1998, pp. 1594-1610.

Romig, Jr., A.D., et al. "Materials issues in Microelectromechanical devices: science, engineering, manufacturability and reliability", 2003 Acta Materialia Inc., Published by Elsevier Ltd., pp. 5837-5839.

Teh, W.H., et al. "Near-zero curvature fabrication of miniaturized micromechanical Ni switches using electron beam cross-linke PMMA", 2003 IOP Publishing Ltd., Institute of Physics Publishing pp. 591-598.

Huang, X.M.H., "Nanomechanical Hydrogen Sensing", Applied Physics letters 86, 2005 American Institute of Physics, pp. 143104-1 to 143104-3.

Saha, Ranjana, et al. "Effects of the substrate on the determination of thin film mechanical properties by nanoidentation", Acta Materialia 50 (2002) pp. 21-38.

Harper, J.M.E., "Microstructure control in semiconductor metallization", 1997 American Vacuum Society, Review Article, pp. 763-779.

Sasakil, Hiroyuki, et al. "Materials Transactions", vol. 42, No. 8, pp. 1561-1565, Abstract Only, 2001.

Somekawa, Hidetoshi et al., "Diffusion bonding in ultra fine-grained Al-Fe alloy indicating high-strain-rate superplasticity", Acta Materials, pp. 1051-1059, 2004.

Mukai, T., et al., "Nanostructured Al-Fe alloys produced by e-beam deposition: static and dynamic tesile properties", Acta Materialsd, pp. 4197-4199, 2003.

Habazaki, H., et al. "New amorphous alloys resistant to high temperature corrosion", Mater. Sci. Eng. A pp. 181-182, Abstract Only, 2003.

Masalski, T.B., ed. 1990 Binary Phase Diagrams vol. 1 (Materials Park, Ohio: ASM International) 173, Abstract Only.

Habazaki, H., et al. "Nanoscale Enrichments of Substrate Elements in the Growth of Thin Oxide Films", 1997, Corrosion Science 39, pp. 731-737.

Crossland, A.C., et al., "The Composition and Morphology of Anodic Films on al-Mo Alloys", 1997 J. Electrochem. Soc. 144—pp. 847-855.

Janik-Czachor, M., et al. "Passivity and its breakdown in Al-based amorphous alloys", 2005 Mat. Chem. Phys. 92—pp. 348-353.

Habazaki, H., et al. "Anodic Film Formation on a Sputter-Deposited Al-30 AT% Mo Alloy", 1995 Corrosion Science 37, pp. 1497-1509.

Habazaki, H., et al. "New Amorphous Alloys resistant to high temperature corrosion", 1994 Mater. Sci. eng. A181/182, pp. 1099-1103, Abstract Only.

Wolowik, A., et al. "Anodic behaviour of Al-refractory metal amorphous alloys", 1999 Mater. Sci. Eng. A267—pp. 301-306.

Zduji, M., et al. "Intermetallic Phases by the heat treatment of mechanically alloyed Al—Mo powders", 1994 Mater. Sci. Eng. A185-77, Abstract Only.

Monagheddu, M., et al. "Local Icosahedral Symmetries in Al-Mo Alloys Prepared by Ball Milling", 1999 NanoStructural Mat. 11, pp. 1253-1261.

Colgan, E.G., et al., "Thin-film reactions of Al with Co, Cr, Mo, Ta, Ti, and W", 1989 J. Mater. Rs. 4, pp. 815-820.

Bates, R.I., et al. Deposition of highly supersaturated metastable aluminium-molybdenum alloys by closed field unbalanced magnetron sputtering; 1996 Vacuum 47, pp. 107-111.

Zhang, Wei, et al., "Sliding Wear Study of Ion-Beam mixing Ni-Mo Multilayer films on steel", 1996 Elsevier Science S.A., pp. 228-232.

de Boer, F.R., et al. "Cohesion in Metals—Transition Metal Alloys", Elsevier-Scientific Pub., 1988, Abstract Only.

Miedema, A.R., et al. "Cohesion in Alloys—Fundamentals of a Semi-Empirical Model", Physica B 100 (1980), 1-28.

Wang, S.Z., et al. "Phase selection in magnetron sputter-deposited TiAl alloy", 2002 Elsevier Science B.V., pp. 141-146.

Smereka, Peter, et al. "Simulation of faceted film growth in three dimensions: microstructure, morphology and texture", 2004 Acta Materialia Inc., pp. 1191-1204.

Farhat, Z.N., et al. "Effect of grain size on friction and wear of nanocrystaline aluminium", 1996 Mater. Sci. Eng. A206, pp. 302-313.

Bales, G.S., et al. "Macroscopicmodel for columnar growth of amorphous films by sputter deposition", J. Vac. Sci. Technol. A9 (1991), pp. 145-149.

Klug, H.P., et al. "X-ray Diffraction Procedures for Polycrystalline and Amorphous Materials", John Wiley & Sons, NY, 2nd Ed., 1974, Abstract Only.

Massalski, T.B. Binary alloy Phase Diagrams, Vol. 2, ASM International, Materials park, Ohio, 2nd Ed. 1990, Abstract Only.

Mirshams, R.A., et al. "Nanoindentation of Nanocrystalline Ni with Geometrically Different Indenters", Mater. Sci. Eng. A372 (2004), pp. 252-260.

Zhao, B., et al. "Formation of Metastable Alloy film in the Ni-Mo Binary System by Ion-Beam-assisted deposition", Appl. Phys. A 77 (2003), pp. 523-528.

Cantor, B., et al. "Metastable Alloy Phases by Co-Sputtering", Acta Metall. 24, (1976), pp. 845-852, Abstract Only.

Oliver W.C., et al. "Measurement of Hardness and Elastic Modulus by Instrumented Indentation: Advances in Understanding and Refinements to Methodology", 2004 Mat. Res.Soc.3-20.

Farhat, Z.N., et al. "Effect of Grain Size on Friction and Wear of Nanocrystalline Aluminium", 1996 Mater. Sci. Eng., 302-313.

Yoder, K.B.,et. al."Activation Analysis of Deformation in Evaporated Molybdenum thin films", 2003 J. Phys. D., Appl. Phys. 884-895.

Peterson, K.E., "Silicon as a mechanical material", 1982 IEEE Proc., pp. 420-457, Abstract Only.

Kaye, G.W.C., et al. "Tables of physical and chemical constants" 15th ed. (London, U.K., Longman), Abstract Only, 1986.

Landauer, Rolf, "The electrial resistance of binary metallic mixtures", 1952 J. Appl. Phys., pp. 779-784.

Rowlands, J.A., et al. "The electrical resistivity and deviations from Matthiessen's rule of single-crystal pure Cd and dilute Cd-Mg alloys", 1978 J. Phys. F:Metal Phys.

Yoder, K.B.,et al. "Activation Analysis of Deformation in Evaporated Molybdenum Thin Film", 2003 IOP Publishing Ltd., pp. 884-895.

* cited by examiner (b)

(a)

(b)

NANOCOMPOSITE FILMS

CROSS-REFERENCE TO RELATED APPLICATIONS

The present application claims the priority benefit of U.S. Provisional Patent No. 60/853,305, filed Jul. 31, 2006, entitled Metallic Nems Components Fabricated from Nanocomposite, the contents of which are incorporated herein by reference.

STATEMENT OF GOVERNMENTAL SUPPORT

The invention described and claimed herein was made in part utilizing funds supplied by the U.S. Department of Energy under Contract No. DE-AC03-76SF00098, and more recently under DE-AC02-05CH11231. The United States government has certain rights in this invention.

FIELD OF THE INVENTION

The present invention relates generally to nanocomposite molybdenum alloy films and nanoelectromechanical system (NEMS) components fabricated from such films.

BACKGROUND OF THE INVENTION

The transition from micro-scale to nano-scale devices, or MEMS to NEMS technology is a subject of intense scientific and engineering interest [1,2]. Most structural components in NEMS are synthesized from single crystal or polycrystalline silicon, or silicon carbide, silicon nitride, or silicon oxide thin films, with silicon being by far the most widely applied [7]. Silicon is easy to etch, elastically stiff and very hard. However, it has low fracture strength and poor wear characteristics, resulting in low reliability for moving components that contact other structures [8]. Silicon is also poorly suited to functional, electrically conductive applications.

MEMS/NEMS cantilever devices fabricated from thin film materials are the building block of many pieces of advanced equipment such as sensors and actuators. Low surface roughness and intrinsic stress, high hardness and modulus and good conductivity are some of the preferred features for high performance of these devices as the structural components of high-precision instruments.

Metallic films can provide better ductility and high electrical conductivity, but generally suffer from low strength and low modulus. Electroplated Ni films, while being commonly used for high aspect ratio micro-systems in MEMS, have not achieved widespread application for nano-scale structures. To date, the smallest feasible dimensions reported in a Ni-based single anchored cantilever were 10 µm long, 4 µm wide, and 210 nm thick [9]. Amorphous Au—Pd, which was successfully synthesized as a double-anchored cantilever with dimensions of 8 µm×100 nm×30 nm [10], is considered a much better candidate for NEMS applications.

The most widely used metallic thin film for functional applications is aluminum because of its compatibility with device processing. Unlike Si, Al is ductile and resists fracture. The critical problem with using Al for structural applications is that in pure form, or with minor alloying additions, the material is weak [11,12] and unable to withstand the stresses associated with fabrication of NEMS, such as device release steps. In addition, large surface roughness caused by extensive grain growth during deposition precludes its usage in most NEMS applications. A significant advantage of Al is that such Al-based materials could also carry significant electrical current. However, only with a markedly improved combination of strength and surface smoothness can Al-based materials become structural building blocks for NEMS devices.

One approach to obtain superior mechanical properties in Al films is to co-deposit Al with other alloy additions [13-16] onto high temperature substrates to create either single phase supersaturated solid solutions with relatively coarse intermetallic precipitates (Al—Fe, Al—Ti or Al—Cr—Fe), or completely amorphous structures (Al—Fe).

There is a need in the art for metallic thin films which may be used in nano-scale devices, which are electrically conductive at room temperature and may otherwise mitigate the difficulties in the prior art.

SUMMARY OF THE INVENTION

The present invention relates to molybdenum alloy thin films comprising aluminum or nickel.

In one aspect, the invention comprises a nanocomposite molybdenum alloy thin film. The nanocomposite film comprises a microstructure comprising nanocrystalline molybdenum in an amorphous metallic matrix. In one embodiment, the creation of this microstructure is governed both by the thermodynamics and the kinetics of the growth process. In one embodiment, the amorphous matrix comprises aluminum or nickel.

Thus, in one embodiment, the invention comprises an aluminum-molybdenum nanocomposite film having a Mo component ranging between about 2 at. % and 50 at. %, preferably between about 16 at. % and about 32 at. %. The film preferably comprises a dense distribution of nanoscale molybdenum crystallites dispersed in an amorphous aluminum rich matrix. In one embodiment, the Mo component is about 32 at. %. The nano-indentation hardness of one embodiment of the film is greater than about 3.5 GPa and may be as high as about 6.2 GPa.

In another embodiment, the invention comprises a nickel-molybdenum nanocomposite film having a Mo content between about 23 at. % Mo and about 69% Mo, and is preferably about 44 at. % Mo.

In another aspect, the invention comprises a method of forming a nanoscale cantilever fabricated from a nanocomposite film as described or claimed herein, comprising the steps of:
 (a) patterning a resist;
 (b) developing the resist;
 (c) etching the resist;
 (d) depositing the nanocomposite film and releasing the resulting cantilever.

In another aspect, the invention comprises a nanoscale cantilever fabricated from a nanocomposite film as described or claimed herein. In one embodiment, the cantilever may be fully released and have a length greater than about 1 µm, a width less than about 800 nm, and a thickness less than about 50 nm.

BRIEF DESCRIPTION OF THE DRAWINGS

In the drawings, like elements are assigned like reference numerals. The drawings are not necessarily to scale, with the emphasis instead placed upon the principles of the present invention. Additionally, each of the embodiments depicted are but one of a number of possible arrangements utilizing the fundamental concepts of the present invention. The drawings are briefly described as follows:

FIG. 10C shows the RMS surface roughness of the Al—Mo films, as obtained by AFM. FIG. 10D shows the effect of Mo content on the resistivity of the films, with the bulk Al and Mo resistivity values shown for reference.

FIG. 16A shows a low magnification SEM image of an array of double anchored paddles. FIG. 16B shows a higher magnification image of an intact paddle from the previous array. FIG. 16C shows a single anchored beam, while FIG. 16D shows a double anchored beam.

DETAILED DESCRIPTION OF PREFERRED EMBODIMENTS

Figure 1:
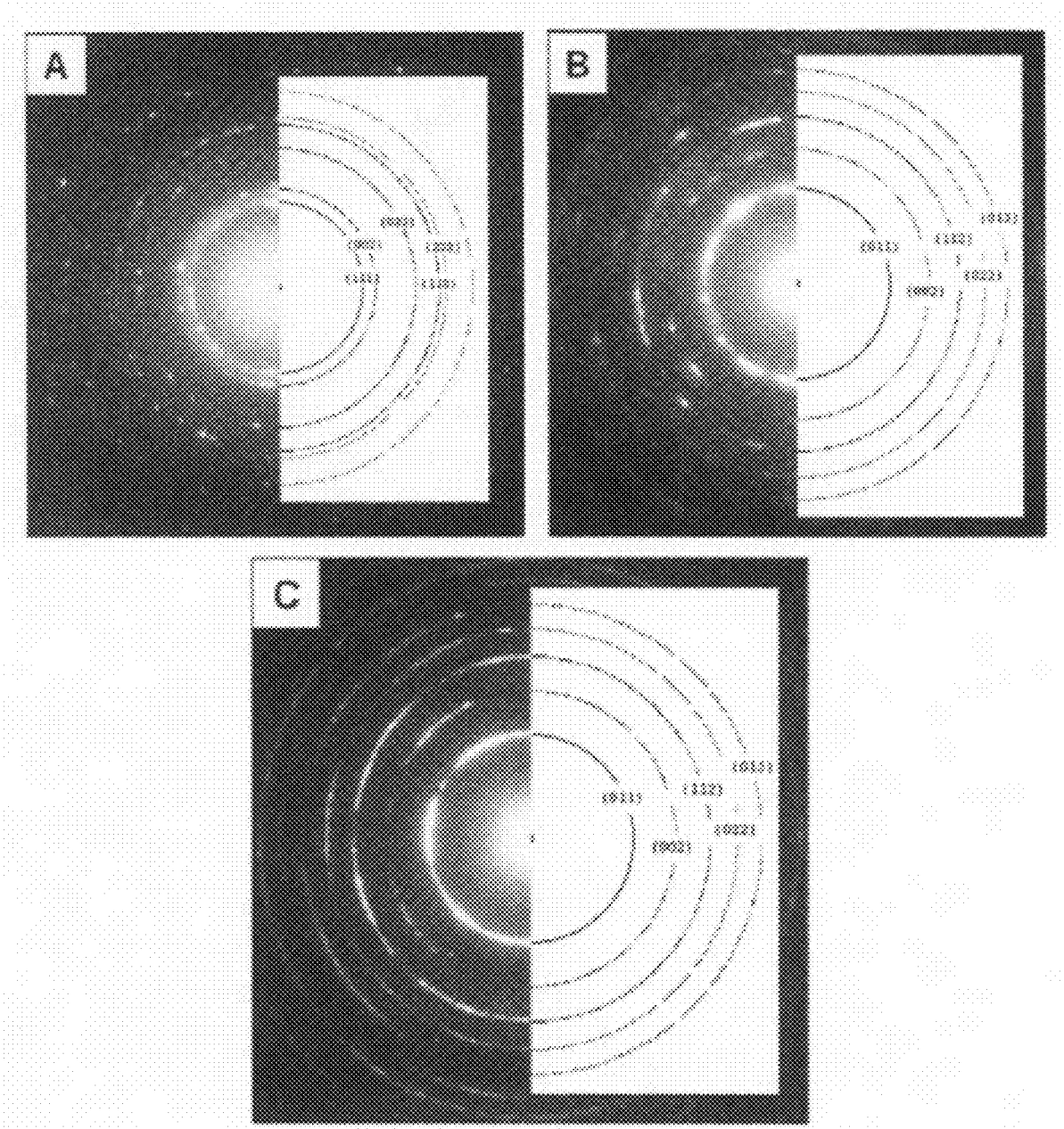
FIGS. 1A-C show selected area diffraction (SAD) patterns of Al-8, 32 and 50 at. % Mo films, respectively.

The present invention provides for NEMS components based on a novel molybdenum alloy thin film. When describing the present invention, all terms not defined herein have their common art-recognized meanings. The term "about", when used with reference to a numerical value, means a range of 10% above or below the numerical value, or within a range of acceptable measurement error or ambiguity.

As used herein, the term "nanocrystal" or "nanocrystalline" means a particle or grain having at least one dimension less than about 100 nm. A nanocrystalline particle or material will have at least one property which differs from the bulk property of the material, as a result of the nanoscale dimension. Preferably, the nanocrystal has at least one dimension less than about 50 nm, for example, less than about 20 nm, or 10 nm, or 5 nm.

As used herein, the term "nanoscale" refers to a size range less than about 100 nm. If used in reference to a device, at least one dimension of the device is less than about 100 nm. Preferably, at least one dimension is less than about 50 nm, for example, less than about 20 nm, or 10 nm, or 5 nm.

As used herein, the term "amorphous" means a material which does not exhibit any particular pattern in atomic order.

In one embodiment, the film comprises aluminum and molybdenum. In another embodiment, the film comprises nickel and molybdenum. In both examples, the applicants have characterized the invention and the effect of Mo content on the microstructure and properties of the alloy films, using nanoindentation, atomic force microscopy (AFM), four-point resistance measurement and transmission electron microscopy (TEM).

There are several properties that unite Al—Mo and Ni—Mo and make such microstructures possible. First, each of Al and Ni have a high heat of intermetallic formation with molybdenum, which favors amorphization during film growth. Second, there is a large atomic size mismatch between Al and Mo, and Ni and Mo, which is another factor to drive amorphization of the matrix. It also dictates the atomic packing factor and the number of nearest neighbors in the amorphous phase. Third, each of Al and Ni have little room temperature equilibrium solubility with Mo, which also favors amorphization rather than just extending the solubility curve. Fourth, Al and Ni have dissimilar crystal structures (Al and Ni are fcc, Mo is bcc), which favors the formation of a secondary crystalline phase out of an amorphous matrix.

Al—Mo offers several refractory phases that could be used for strength and stability. The Al—Mo phase diagram consists of the Al and Mo phases, with negligible mutual solubility below 400° C. [17]. The melting point of pure Al is 660° C., whereas the melting point of pure Mo is 2623° C. There are five intermetallic phases, $Al_{12}Mo$, $Al_5Mo$, $Al_4Mo$, $Al_8Mo_3$, and $Al_3Mo$. Previous work has focused on the corrosion properties and oxide formation of Al—Mo synthesized at elevated temperatures (above 700° C.), demonstrating that Al—Mo films have far superior corrosion resistance than pure Al [18-23]. Phase formation in ball-milled Al—Mo has been studied by neutron and X-ray diffraction [24,25] as well as Rutherford backscattering spectroscopy [26]. One report also focused on some microstructural aspects of phase formation in co-sputtered Al—Mo films, using a combination of X-ray diffraction and scanning electron microscopy (SEM) analysis [27].

The Ni—Mo phase diagram contains several intermetallic phases [28] that have complex crystal structures and can be formed under equilibrium conditions. The number of intermetallic phases that are formed in equilibrium conditions is attributed to the heat of mixing of the two elements in the system ($\Delta H_{mix(Ni-Mo)}$=−7KJ/mole [29]); the more negative the heat of mixing, the higher the number of intermetallics that can be formed over the full range of composition. Under non-equilibrium conditions, however, as is the case for vapor deposition for instance, the formation of equilibrium stable phases is hard to achieve. The atoms, therefore, will tend to stay close to each other without forming any crystallographic structures, especially when the percentage of the solute and atomic mismatch are relatively high ($r_{Ni}$=0.35167 nm and $r_{Mo}$=0.31468 nm) [30]).

A preferred embodiment of the present invention comprises a compositionally optimized Mo alloy film as the basic structural building block of NEMS devices. Such films may be fabricated into nanoscale cantilevers of various geometries. The films may be produced by a vapor deposition technique, such as DC magnetron sputtering.

The molybdenum alloy films of the present invention are characterized by a microstructure wherein the molybdenum exists as nanocrystallites in an amorphous metallic matrix. Such a microstructure provides a film with a smooth surface, and with high surface hardness.

In one embodiment, the alloy films comprise between about 8 at. % Mo and about 69 at. % Mo. In one embodiment, the alloy film comprises about Ni-23 at. % Mo to about Ni-69 at. % Mo. In a preferred embodiment, the alloy film comprises about Ni-44 at. % Mo. In another embodiment, the alloy film comprises about Al-8 at. % Mo to about Al-at. 50% Mo. In another preferred embodiment, the alloy film comprises about Al-32 at. % Mo.

In pure nickel and Ni—Mo films up to about 23 at. % Mo, a fully crystalline FCC structure is obtained for the films and the microstructure follows Vegard's rule, which is the rule of mixture for substitutional solid solutions. It states that the change in lattice parameter of the solvent scales linearly with the percentage of the solute. Above about 78 at. % Mo, a fully crystalline BCC structure is obtained.

In aluminum films up to the Al-8 at. % Mo, all Mo present is in Al based fcc solid solution, and this can be attributed to kinetics of the competition between deposition flux and surface diffusion. These films exhibit a standard columnar microstructure and follow Vegard's rule. The majority of the grains nucleate at the substrate and grow all the way to the surface. The average surface grain size is about 160 nm. However, above Al-8 at. % Mo, such as at Al-16 at. % Mo and Al-32 at. % Mo, the microstructure of the film comprises nanocrystalline Mo islands densely and randomly dispersed in an amorphous Al-rich matrix, and the surfaces display smooth morphology characteristic of sputtered amorphous films. Above about Al-50 at. % Mo film, all Al present is in solid solution within the BCC matrix.

The Al—Mo films' surface roughness, determined by AFM and confirmed by cross-sectional TEM, decreases steadily as the Mo content increased, from 124 nm for pure Al film down to about 1 nm for the Al-32 at. % Mo. As one skilled in the art would expect, in the 50 at. % Mo sample, where the film is again crystalline, the RMS roughness quickly increases to nearly 100 nm.

The Ni—Mo films' surface roughness is much smoother than that of pure Ni (grain size about 115 nm) and pure Mo (grain size about 83 nm). In an intermediate range of about Ni-30 at. % Mo to about Ni-70 at. % Mo, the surface roughness decreases to less than about 67 nm. Thus roughness values are about one order of magnitude lower than pure Ni and Mo, providing very smooth surfaces of the amorphous-nanocrystalline microstructure. The RMS decreases with Mo content from 10 nm (for pure Ni) and is remarkably smooth for the middle range (less than 1 nm). It increases then as a result of crystalline structure and columnar growth to pure Mo (8 nm). In crystalline films, surface roughness scales with grain size, which in turn, depends on rate of deposition, deposition temperature and substrate type. It also scales with square root of thickness for van der Drift type of growth and is the case for the whole range of composition except for the microstructure of the present invention, produced when Mo content is within the intermediate ranges described herein. In a microstructure of the present invention, the film comprises a nanocomposite phase that does not follow the rules of polycrystalline and columnar growth. The amorphous-nanocrystalline microstructure is present through the thickness and no columnar growth is observed.

The nanoindentation hardness of the Al—Mo films peaks at about 6.3 GPa at a composition of 32 at. % Mo, and then decreased to 3.5 GPa at 50 at. % Mo. Thus, the highest hardness is achieved in the amorphous—nanocrystalline regime. The maximum reduced modulus of 155 GPa occurred in the Al-16 at. % Mo composition. Mo concentrations higher than 16 at. % have slightly lower moduli.

In a Ni—Mo film, nanoindentation hardness is very high for the middle range of composition (from Ni-34 at. % Mo to Ni-69 at. % Mo) compared to pure Ni and pure Mo (polycrystalline). For the compositions below 30 at. % Mo and above 69 at. % Mo, the nanohardness increases which is due to solid solution hardening and Hall-Petch effect (reduced grain size). Modulus falls in the range of 150-200 GPa for the films from Ni-23 at. % Mo to Ni-69 at. % Mo, and peaks at about Ni-78 at. % Mo. Without restriction to a theory, it is believed that the high hardness and modulus for the middle range of composition (34 at. % Mo-69 at. % Mo) is due to the nanocomposite structure and high hardness of the amorphous phase which is generally higher than that of polycrystalline material for the same material. This is likely due to the absence of dislocations in amorphous phase that makes the plastic deformation and resistance to fracture higher in these materials.

Structures fabricated from the nanocrystalline material of the present invention should preferably have sufficient electrical conductivity to be useful for NEMS applications requiring the capacity to carry significant current at room temperature, as needed for static capacitive, resistive or tunneling device sensing.

Resistivity of a pure Al film was around $5\times10^{-8}$ $\Omega\cdot m$, slightly higher than that of bulk Al, as is expected of a polycrystalline thin film, due to decreasing grain sizes, increasing defect density, and decreasing degree of crystallinity. Peak resistivity occurs in the 32 at. % Mo film.

The conductivity of the nanocomposite Ni—Mo films is about an order of magnitude lower than that of pure Ni and pure Mo (polycrystalline); however, it is still in the range of metals. Resistivity increases with Mo content as a result of reduced grain size, increased defects amount, and decreased degree of crystallinity. The amorphous phase is believed to be less conductive as a result of reduced mean free path length compared to a crystalline phase.

Figure 16:
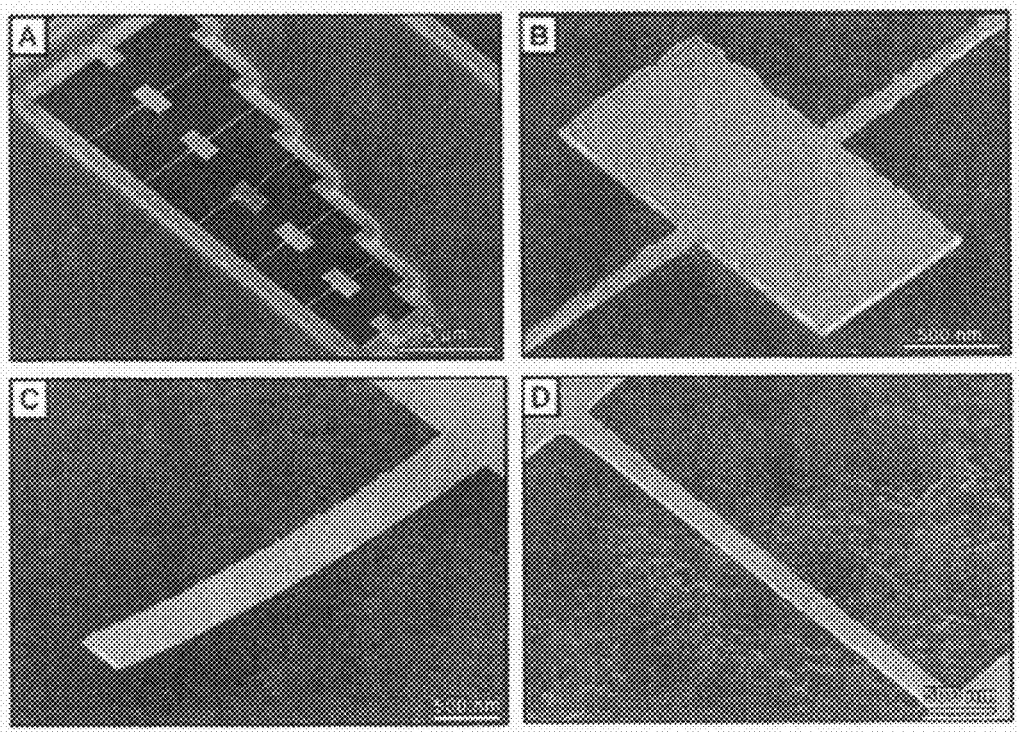
FIG. 16 shows typical NEMS structures fabricated from Al-32 at. % Mo films.

Utilizing its low roughness, nanocantilevers and nanopaddles of various geometries from the Al—Mo or the Ni—Mo nanocomposite films may be fabricated. Such component geometries are often used in various NEMS devices, particularly in cantilever-based sensor applications. Typical structures are shown in FIG. 16 where, in one embodiment, the devices possess a minimum width of 400 nm and a thickness of 4.3 or 20 nm. FIG. 16A shows a low magnification SEM image of an array of double anchored Al—Mo paddles. The figure shows a single paddle (in the middle), which was broken on one side during the release step, slumping through the release gap due to its own weight. FIG. 16B shows a higher magnification image of an intact paddle from the previous array. FIG. 16C shows a single anchored beam, while FIG. 16D shows a double anchored beam.

The resonance of cantilevers, made of Al-32 at. % Mo, is around 608 kHz. Assuming a rule of mixtures, the calculated value of a Young's modulus of E=112 GPa for the cantilevers is in good agreement with nanoindentation analysis.

The Al—Mo and Ni—Mo alloy films of the present invention may be processed in similar manner as a conventional Ni or Al film, allowing integration into existing microfabrication routes, well within the ability of those skilled in the art. Because of the improved strength and stiffness of these alloys, as well as its smooth surface, thin metal cantilevers may be realized. Similar fully-released structure of these dimensions (less than 5 nm thickness in one embodiment) are very difficult or impossible to fabricate using conventional Al or Ni films, due to their low strength and stiffness, combined with a high surface roughness due to a large grain size.

The nanocomposite Mo alloy films of the present invention may be formed by any suitable thin film deposition method, such as co-evaporation or sputtering. In a preferred embodiment, the films are formed by DC magnetron co-sputtering, which is a technique well known by those skilled in the art. The stoichiometry of the alloy components may be controlled by controlling the sputtering rate of the two targets.

EXAMPLES

The following examples are intended to be illustrative, but not limiting, of the claimed invention.

Example 1

Al—Mo Films

Al—Mo films of nominal compositions ranging from pure Al to Al-50 at. % Mo (0, 2, 4, 8, 16, 32 and 50 at. % Mo) were synthesized by DC magnetron co-sputtering from pure Mo and pure Al targets. The argon sputtering pressure was 7.0 mTorr with a base pressure of $1 \times 10^{-6}$ Torr. The films were deposited onto laboratory-grade naturally oxidized 4 inch silicon <100> wafers, which were either cleaned with a 3:1 mixture of 51% $H_2SO_4$ and 30% $H_2O_2$ or etched with HF prior to deposition. Sputtering was performed in a sputter-up configuration with substrate rotation during deposition to ensure film uniformity. The Al sputtering rate was kept constant at 10.5 nm/min (300 W power) while the Mo sputtering rate was adjusted to create the desired stoichiometry. The thicknesses of the deposited films were measured using cross sectional TEM and SEM and confirmed with physical profilometry. All films had a thickness in the range of 1.5-2.0 μm. Because there was some thickness variation on the outer edges of the wafers, only the center 2-inch portion of the wafer was used. X-ray photoelectron spectroscopy was used to verify the film stoichiometry as well as to determine contamination levels. The only detectable impurity was oxygen, which was present at a maximum value of 4 atomic percent.

Figure 5A:
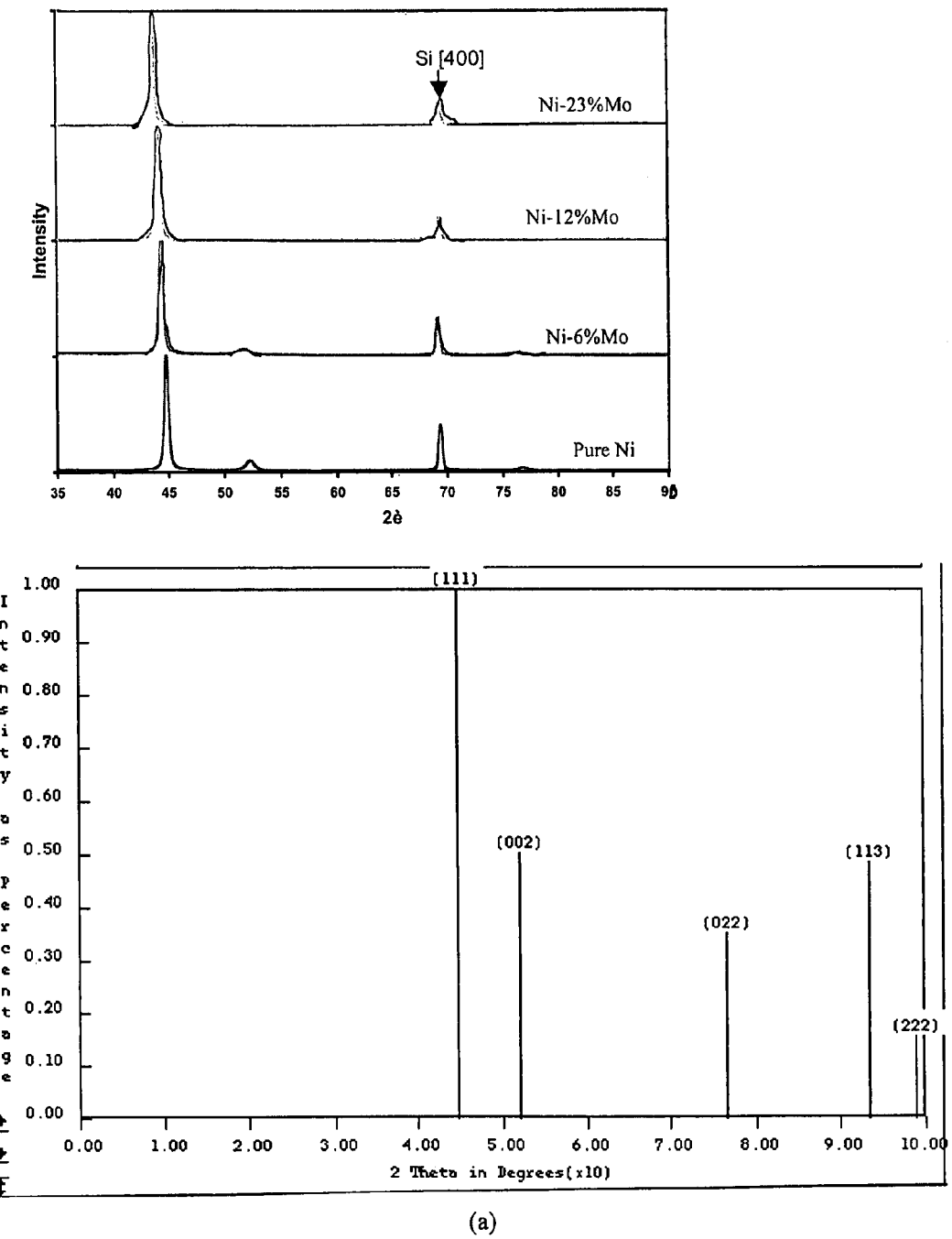
FIG. 5A shows XRD spectra for films comprising pure Ni (bottom) to Ni-23 at. % Mo (top) together with the simulated indices.

FIGS. 1A-C show selected area diffraction (SAD) patterns of the 8, 32 and 50 at. % Mo films, respectively. The inset simulations are for Al (FIG. 1A) and Mo (FIGS. 1B and C). In none of the three cases did we observe any evidence of intermetallics predicted by the equilibrium bulk binary phase diagram. The diffuse background observed in FIG. 1B corresponds to the presence of an amorphous Al-based matrix (further substantiated in FIG. 5). FIG. 1A indicates that at a composition of 8 at. %, Mo is present only in solid solution in an Al-rich fcc matrix. Similar effects are known to occur in other vapor quenched Al systems, such as Al—Ni, Al—Cu and Al—Fe, and are attributed to the kinetics of the competition between deposition flux and surface diffusion [31-33].

An unexpected conclusion drawn from FIG. 1C is that at 50 at. % Mo, all Al present is in solid solution within a bcc matrix. According to the equilibrium phase diagram, 50 at. % Mo corresponds to a two-phase region with coexistence of $Al_8Mo_3$ and a simple cubic ordered $AlMo_3$ phase. While kinetic limitations may explain why equilibrium phase separation cannot be achieved, it is not obvious why at 50/50 only a single Mo phase exists.

Cross sectional TEM specimens were prepared by tripod polishing followed by liquid nitrogen cooled ion milling. Conventional TEM was performed in a JEOL 200CX microscope at 200 kV for phase recognition and detailed microstructure studies. Selected area diffraction (SAD) patterns were used to identify the phases. High resolution imaging was performed at 200 kV in a Philips CM200-FEG TEM and at 150 kV in a Philips CM300-FEG TEM. Simulation of electron diffraction patterns was performed using Desktop Microscopist™ commercial TEM simulation package. Also, we used a conventional x-ray diffraction, XRD, (Bruker AXS Inc., Madison, USA) together with TEM.

Figure 2:
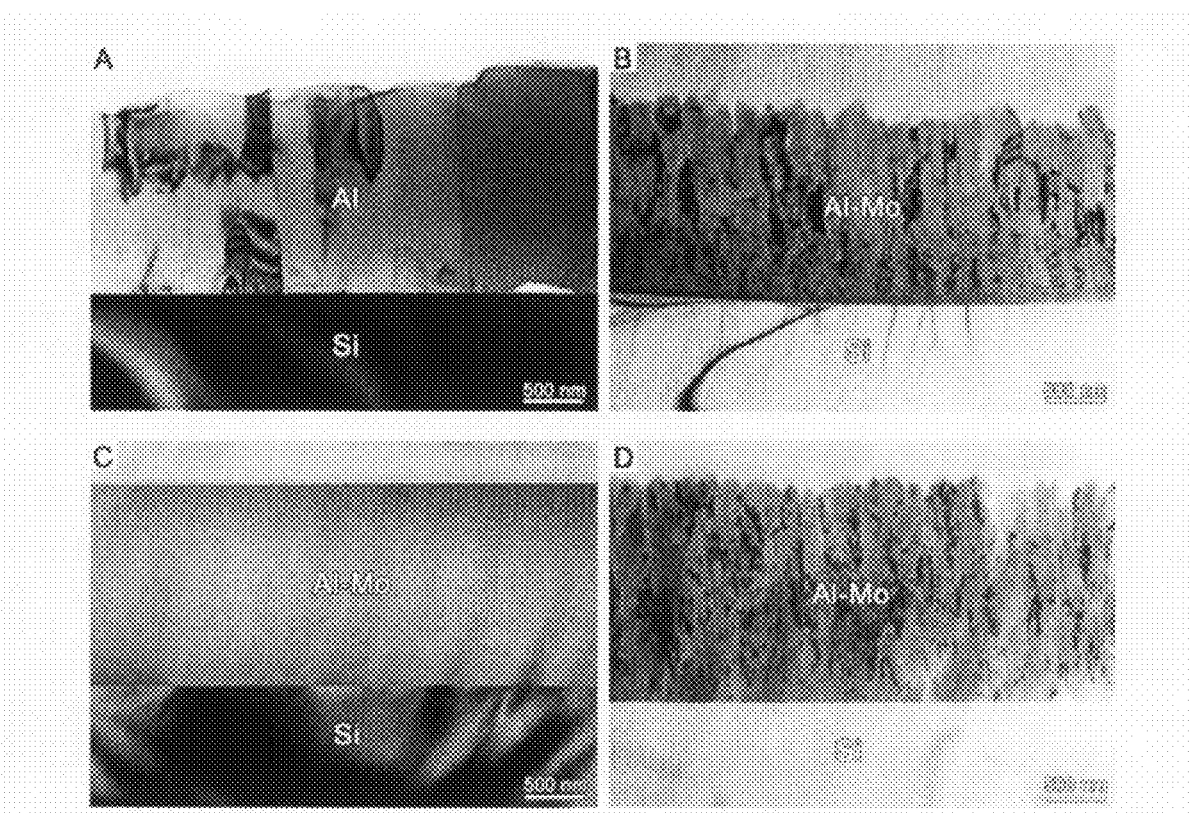
FIG. 2A-D shows a series of cross sectional TEM bright-field micrographs of Al-0, 8, 32 and 50 at. % Mo, respectively.

FIG. 2 shows a series of cross sectional TEM bright-field micrographs of the Al samples containing 0, 8, 32 and 50 at. % Mo. All four images are taken at identical magnification. FIG. 2A shows the standard columnar microstructure of pure Al films. The majority of the grains nucleate at the substrate and grow all the way to the surface. The average surface grain diameter, as obtained by AFM, was about 380 nm. FIG. 2B shows that the growth mode of Al-8 at. % Mo films is distinctly different from that of pure Al. Although the initial nucleation density at the Si interface is extremely high, most grains do not grow all the way to the surface and are subsumed by either faster growing or re-nucleated grains. The average surface grain size of 162 nm is less than half of that in the pure Al films. The increase of grain diameters with film thickness is described by the van der Drift model, which predicts that the grain size scales roughly with the square root of the thickness [34,35]. This mechanism requires a high nucleation density and an anisotropic growth rate. Apparently, the presence of Mo in addition to the Al adatoms on the growth front achieves this effect. This may be due to a reduced overall rate of surface diffusion in the presence of a binary atom flux. In addition, Mo atoms may affect the crystallography of Al nuclei during the initial stages of nucleation and growth. FIG. 2C shows a cross section of the Al-32 at. % Mo film. The film surface is remarkably smooth, characteristic of sputtered amorphous films [36]. The Mo phase, demonstrated to be present in the diffraction pattern, is not visible under bright field conditions. Further investigation revealed that the Al-32 at. % Mo microstructure consisted of nanocrystalline Mo islands densely and randomly dispersed in an amorphous Al-rich matrix. FIG. 2D shows a cross section of the Al-50 at. % Mo sample. Here the microstructure is again crystalline, similar to that of the 8 at. % sample, showing a high nucleation density at the substrate interface and significant roughness at the film surface. Careful analysis provided no evidence for the crystalline intermetallic equilibrium phases or non-equilibrium amorphous phases.

Figure 3:
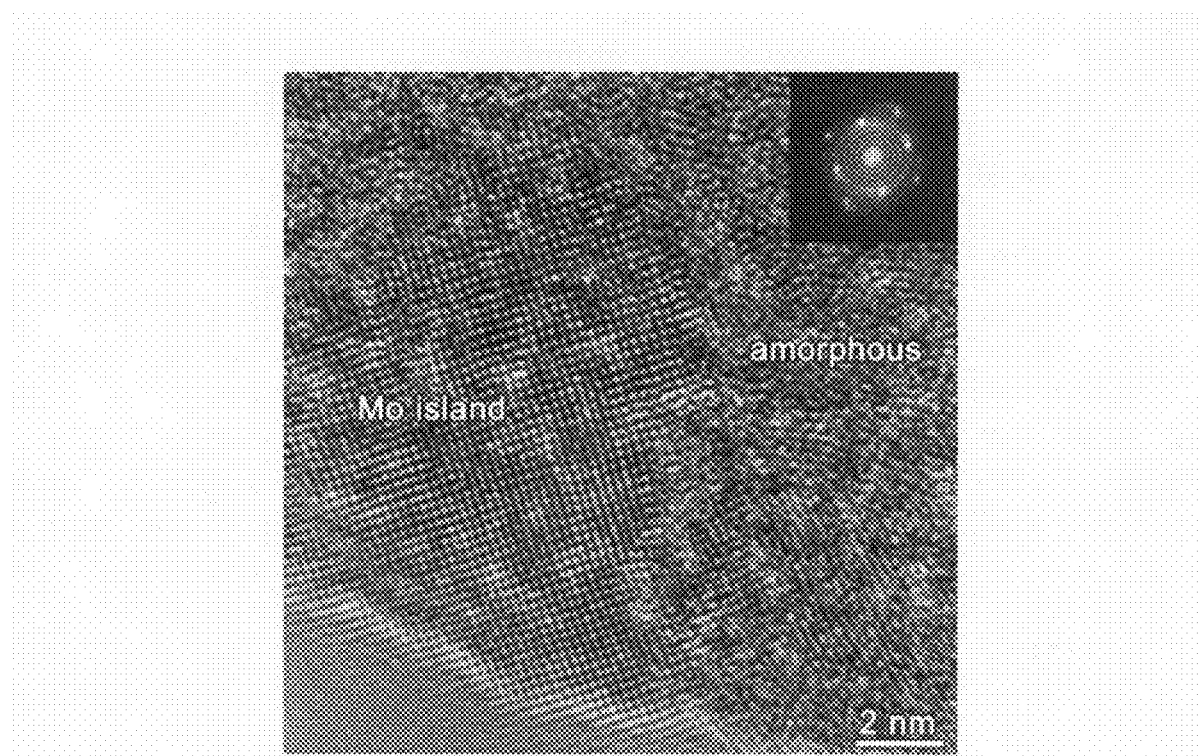
FIG. 3 shows an HRTEM image and inset digital diffractogram showing the microstructure of the Al-32 at. % Mo film.

As seen in FIG. 2, the microstructure of the Al-32 at. % Mo film was strikingly different from that of the other alloy compositions. A more detailed study showed the presence of nanocrystalline Mo islands. This is illustrated in an HRTEM image and inset digital diffractogram in FIG. 3, which clearly shows a crystalline island, corresponding to the bcc Mo phase in [100] orientation. Typical Mo crystallites had sizes between 2 and 20 nm and were found to range from an equiaxed to an elongated morphology. Elongated crystallites tended to be larger than the equiaxed ones.

Example 2

Ni—Mo Films

One μm thick Ni—Mo films were deposited onto 4-inch standard silicon wafers (Silicon Valley Microelectronics, Santa Clara, USA) using a DC-magnetron co-sputtering system (AJA International, N. Scituate, USA). We cleaned the wafers before sputtering using the piranha cleaning solution consisting of 3:1 mixture of 51% $H_2SO_4$ and 30% $H_2O_2$. We synthesized the films by co-sputtering from pure Ni and pure Mo targets. The sputtering was carried out at room temperature with a base pressure of $7.0 \times 10^{-7}$ Torr and argon sputtering pressure of 4.0 mTorr. Deposition was done in a sputter-up configuration while substrate was rotating during the deposition process to ensure the uniformity in the film. To study the microstructures and physical properties of the Ni—Mo binary alloy films, a full range of composition from pure Ni to pure Mo at around 10 atomic percent Mo intervals were synthesized. The Ni deposition rate, therefore, was kept constant at 14.2 nm/s and the Mo rates were changed to make the adjustments to reach the desired stoichiometry. We confirmed the composition of the films by electron dispersed spectroscopy (EDS) mounted on a Hitachi S3000N scanning electron microscope (SEM). Also, we used a 5 nm Ti film as an underlayer to provide better adhesion of the films to the substrate. We measured the thickness of the Ni—Mo deposited films using chemical etching (a hot mixture of HCl and $HNO_3$) and a contact profilometer (Tencor Alphastep) and it was confirmed to be 1000 nm±5 nm.

Figure 9:
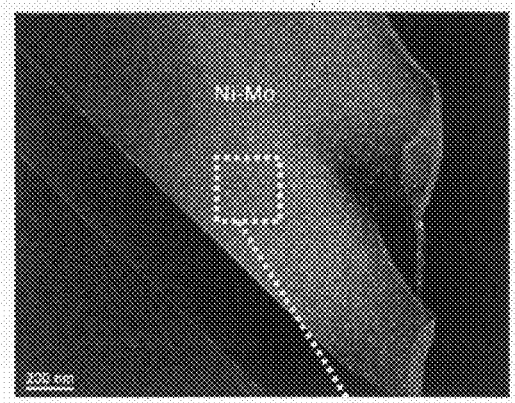
FIG. 9 shows a cross-sectional dark field image and detail of Ni-44 at. % Mo.
Figure 9:
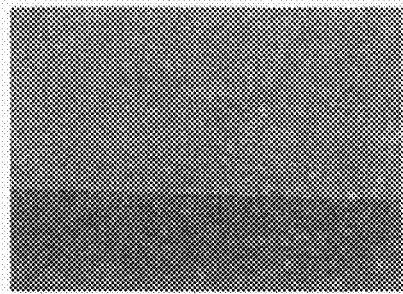

From FIGS. 4A, 4B, and FIG. 9, we can see that the grain growth has been eliminated for the Mo content of 34 at. %<Mo<69 at. %, especially for Ni-44 at. % Mo, compared to pure polycrystalline Ni and Mo films. The surface is, therefore, very smooth[37]. We also performed AFM to image the surface topography of the films with high resolution and the two images corresponding to pure Ni and Ni-44 at. % Mo films are shown in FIG. 4B. The RMS values have been shown as well for comparison purposes.

Figure 5B:
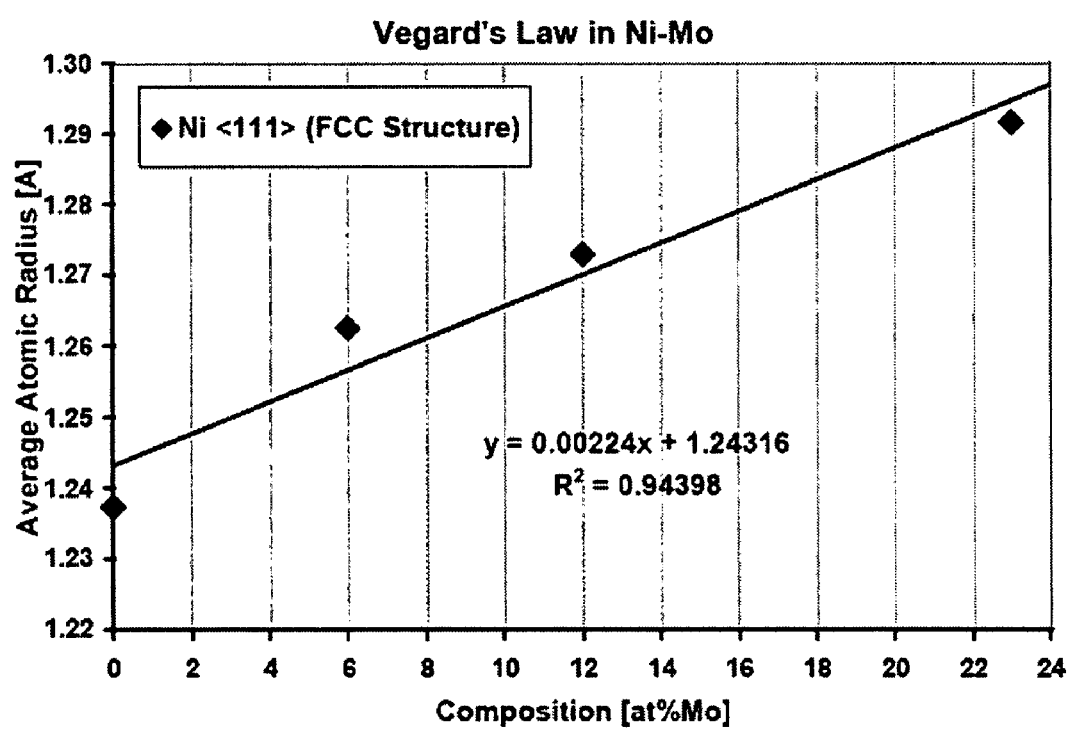
FIG. 5B shows Vegard's rule plot for the same compositions.
Figure 6A:
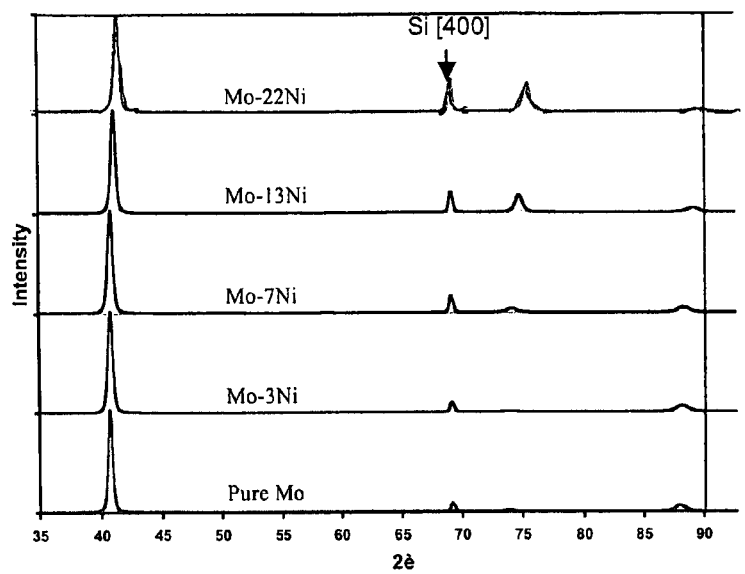
FIG. 6A shows XRD spectra for films comprising pure Mo (bottom) to Mo-22 at. % Ni (top) together with the simulated indices.
Figure 6A:
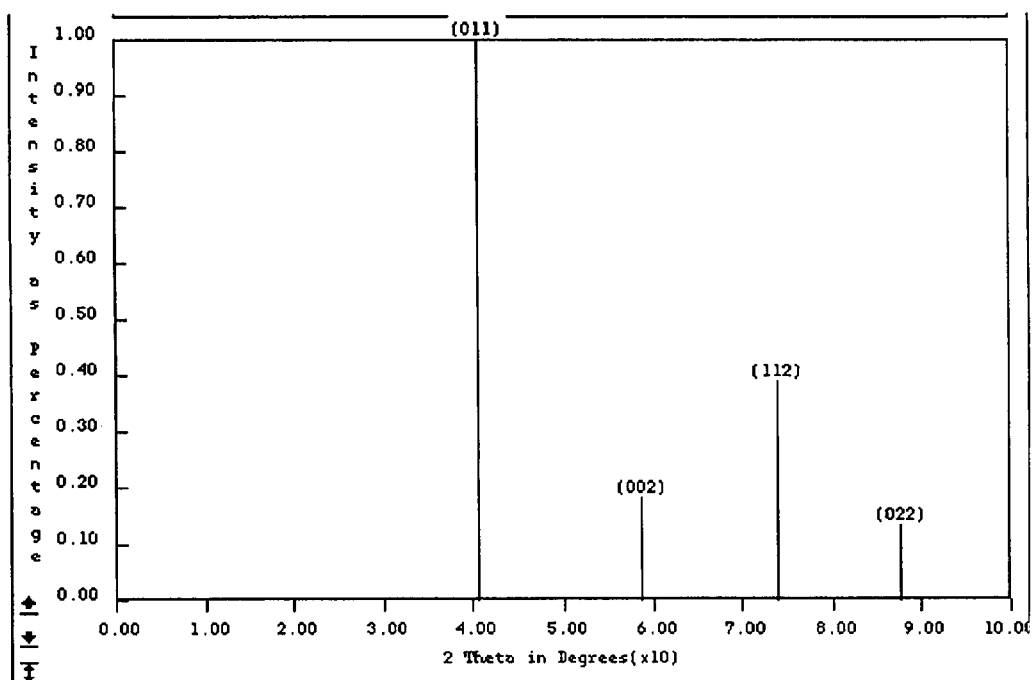
Figure 6B:
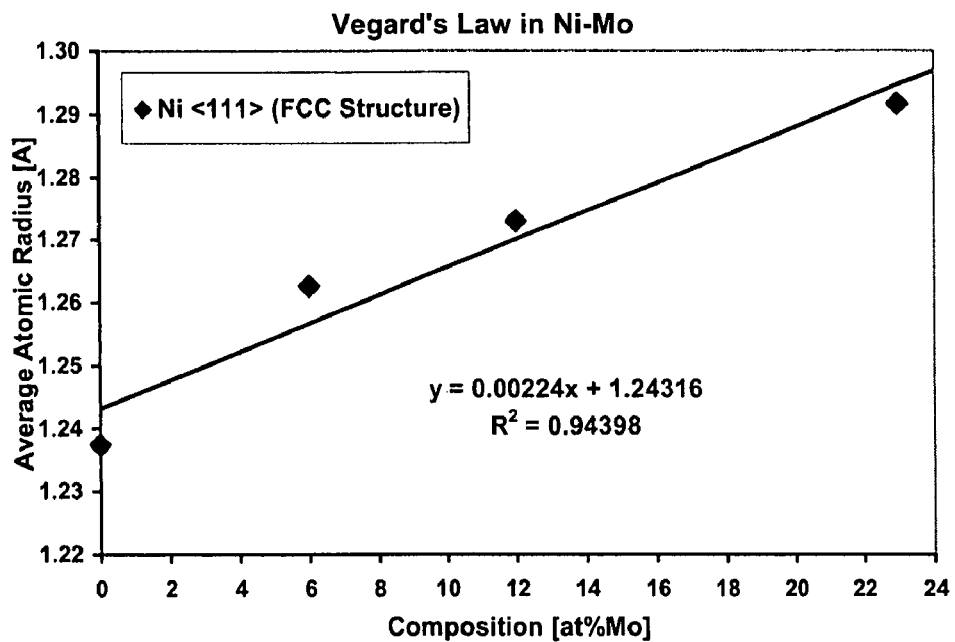
FIG. 6B shows Vegard's rule plot for the same compositions.

We did conventional x-ray diffraction on the films to characterize the phases available in the films. If Mo is added to Ni, we can see from FIG. 5A that up to 23 at. % of Mo a fully crystalline FCC structure is obtained for the films and they follow the Vegard's rule (FIG. 5B). Vegard's rule is the rule of mixture for substitutional solid solutions. It states that the change in lattice parameter of the solvent scales linearly with the percentage of the solute. We can see from these results that no intermetallic phases, which are present at equilibrium for binary bulk alloy, were observed. On the other hand, if we add Ni to Mo, we still will have crystalline structure up to 22 at. % Ni although in BCC format as is shown in FIG. 6A. The linear Vegard's law has been depicted in FIG. 6B showing that the rule of mixture is still valid for this part of composition range.

Figure 7:
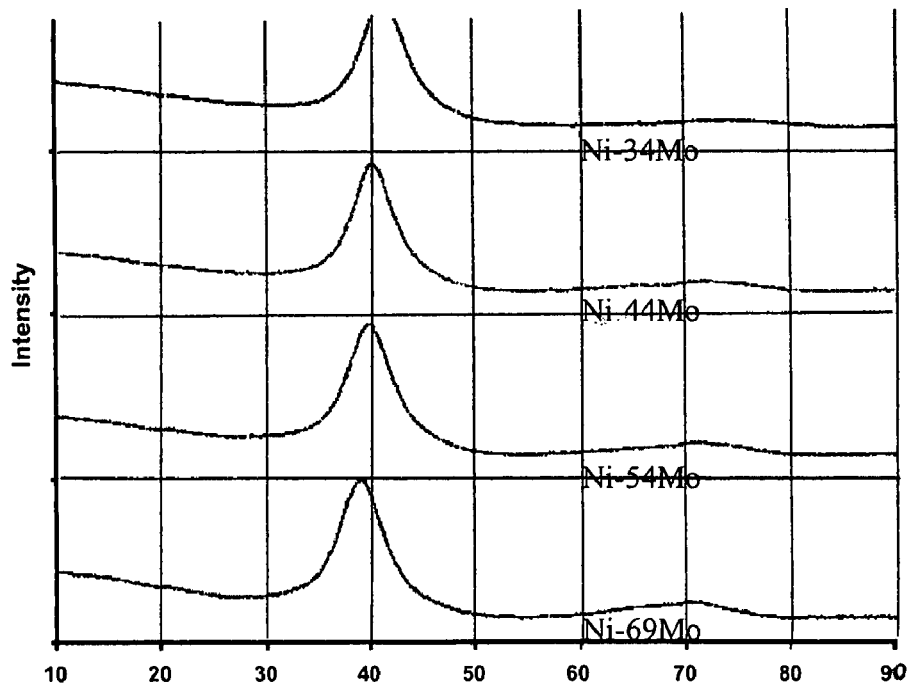
FIG. 7 shows XRD signals for Ni-34 at. % Mo to Ni-69 at. % Mo. Without being restricted to a theory, the peak broadening could be due to either amorphous or nanocrystalline phase, or both. The nanocrystallites' size was estimated to be from 1.5 nm to about 2.5 nm.

The spectra for the middle range of composition (Ni-34 at. % Mo to Ni-69 at. % Mo) is shown in FIG. 7. We can see from these results that either amorphous phase, or nanocrystalline phase or both could be present due to peak broadening [38], By simulation of the peaks, we estimated the nanocrystallite size to be in the range of 1.5 nm-2.5 nm.

Figure 4:
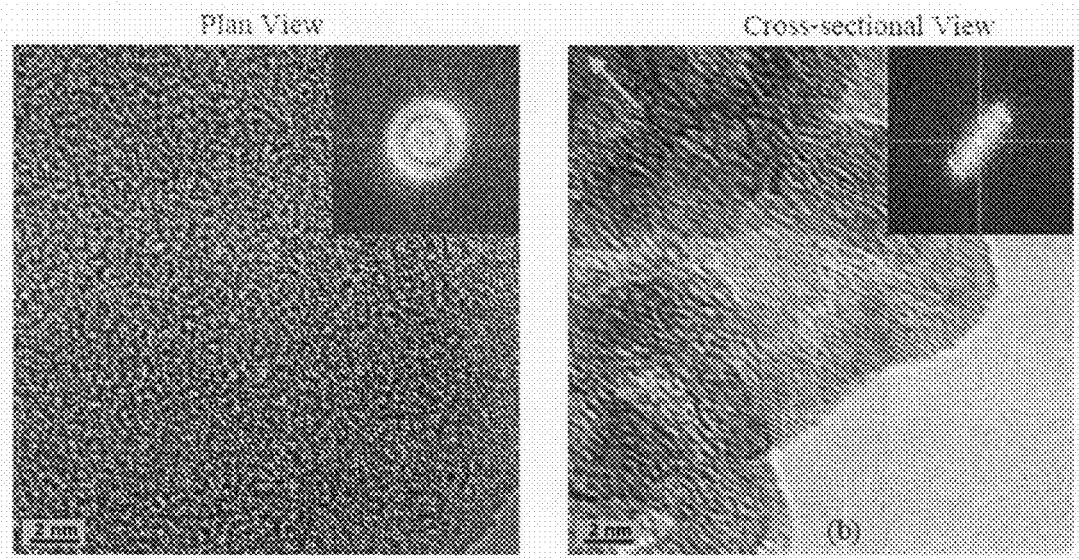
FIGS. 4A and 4B show high resolution electron microscopy images of Ni-44 at. % Mo at both plan and cross-sectional views respectively. The arrow in FIG. 4B indicates growth direction roughly.
Figure 8:
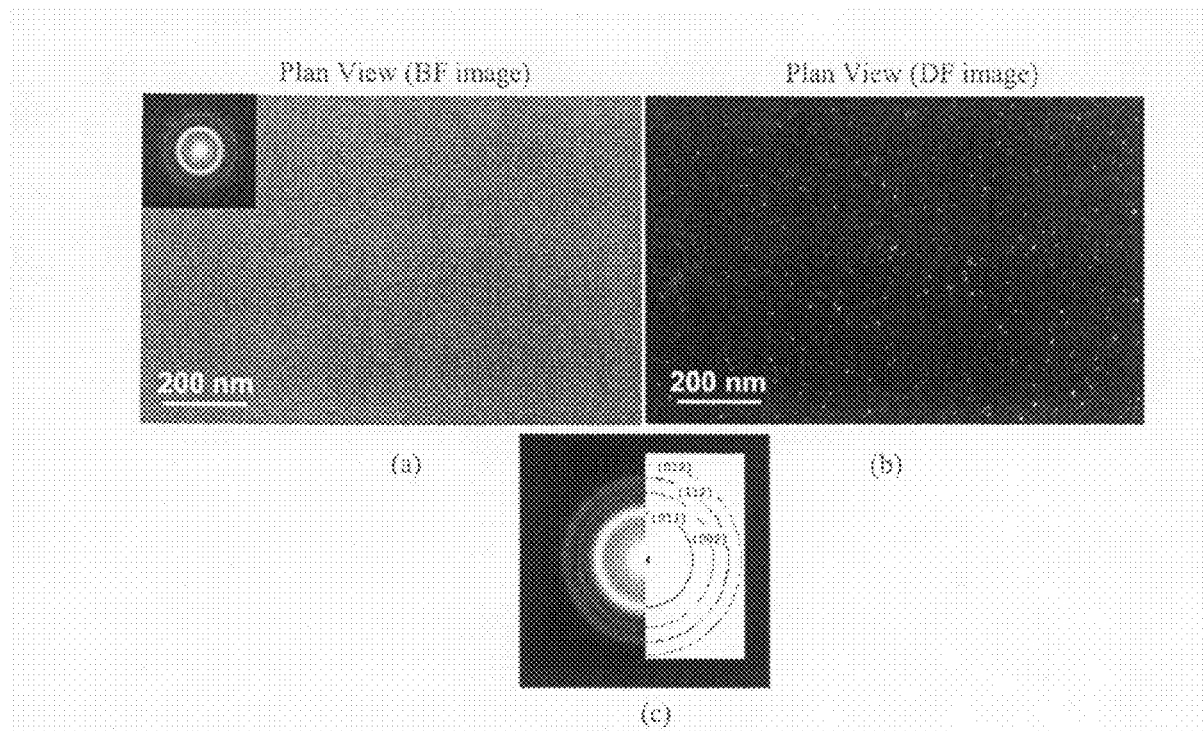
FIG. 8 A-C shows plan view bright field, dark field, and diffraction pattern respectively of Ni-44 at. % Mo.

To have a better understanding of the phases available in the films with Mo content of 34 at. %-69 at. % and make the XRD results more clear, transmission electron microscopy (TEM) was used for phase recognition of Ni-44 at. % Mo film. The results are shown in FIGS. 8 and 9. FIG. 8 shows the bright field (BF) and dark field (DF) plan view images of Ni-44 at. % Mo together with the selected area diffraction pattern (SAD). The cross-sectional view of the film is shown in FIG. 9 as well. As we see from these two figures, the Mo phase is not visible in BF image although we can see it in diffraction pattern. By further investigation, a microstructure consisting of nanocrystallites (BCC islands) randomly and densely dispersed in an amorphous Ni-rich matrix (the diffuse background in FIG. 8C) is present in this film (Ni-44 at. % Mo). Simulation of the diffraction pattern (FIG. 8C) using Desktop Microscopist™ commercial software predicts that the nanocrystallites have a BCC crystal structure the size of which is sub-five nanometers. It should be noted that we did not observe any intermetallic phases, predicted by equilibrium phase diagram [39]. Without being restricted to a theory, the formation of metastable amorphous/nanocrystalline phases could be the low surface diffusion of the atoms after deposition onto the substrate [40,41,42]. This effect becomes more pronounced when the Mo content increases leading to the low overall surface diffusion as the diffusivity of the Mo atoms are lower than Ni and they could control the whole process of the film nucleation, coalescence and growth. High resolution transmission electron microscopy (HRTEM) was also employed to image this sample (Ni-44 at. % Mo) and the results are shown in FIG. 4. From the HRTEM images, we can see the lattice fringes and their directionality with the help of inset digital diffractograms shown at the top-right of each image.

Example 3

Physical Properties—Al—Mo

Mechanical properties of the films were measured using a commercially available nanoindentation load-depth sensing instrument (Hysitron TriboIndenter®), equipped with an AFM. All the tests were performed under identical conditions, using a Berkovich indenter tip and an applied load of 1500 μN or 2500 μN. Each data point represents an average value of 25 individual indentations; all indentations were separated by about 25 μm. The hardness and reduced elastic modulus (which accounts for elastic deformation of the test sample and indenter tip) are determined from the unloading portion of the load-depth curve using the method of Oliver and Pharr [43].

Figure 10:
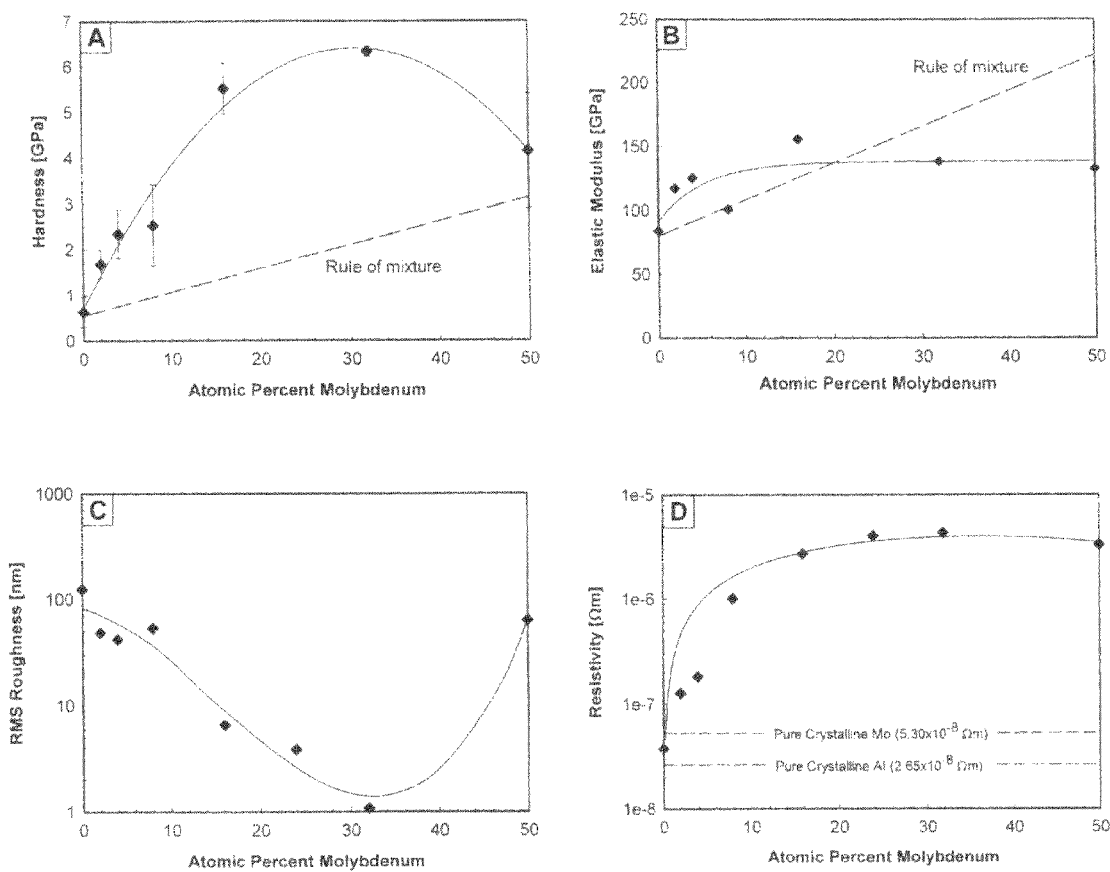
FIG. 10 shows the effect of Mo content on the nanoindentation hardness of Al—Mo films. The reduced elastic modulus of the Al—Mo films as determined from the unloading nano-indentation curve is shown in FIG. 10B.

FIG. 10A shows the effect of Mo content on the nanoindentation hardness of the Al—Mo films. The measured nanoindentation hardness of the pure Al film was 0.6 GPa, agreeing well with results reported in the literature[44]. The rule of mixtures prediction using pure Al and Mo sputtered films is also plotted for reference, where the hardness of pure Al film is taken as 0.6 GPa and the hardness of pure Mo is taken as 5.6 GPa [44,45]. FIG. 10A indicates that the hardness of the films increased up to the peak value of 6.3 GPa at a composition of 32 at. % Mo, and then decreased to 3.5 GPa at 50 at. % Mo. In the crystalline regime, the pronounced increase in the hardness is due to a reduction in the grain size (Hall-Petch effect) as well as solid solution strengthening. The highest hardness, however, is achieved in the amorphous—nanocrystalline regime. This generally agrees with the reported behavior of high strength crystalline-amorphous aluminum bulk alloys, where nano-scale mixtures containing a combination of amorphous, quasi-crystalline and crystalline phases (two out of the three), displayed superior strength to both conventional crystalline and one hundred percent amorphous alloys [46].

The reduced elastic modulus of the Al—Mo films, as determined from the unloading nano-indentation curve, is shown in FIG. 10B. The reduced modulus of the pure Al film was measured as 84 GPa, slightly higher than the accepted Al modulus of 70 GPa (the reduced modulus would be 80 GPa) [46] The maximum reduced modulus of 155 GPa occurred in the Al-16 at. % Mo composition. Mo concentrations higher than 16 at. % had slightly lower moduli.

Film roughness was characterized using a Digital Instruments Dimension 3100 AFM with Nanosensors BS-Tap300 aluminum coated, tapping mode AFM probes. The scan size was varied from 10×10 μm to 1×1 μm, depending on the observed grain size, such that roughly the same number of grains appeared in each image. This also allowed average grain size and the root mean square (RMS) roughness to be calculated based on approximately the same number of grains. The AFM data was processed using Scanning Probe Image Processor version 4.0.6.0, SPIP™ software, which is commercially available.

FIG. 10C shows the RMS surface roughness of the Al—Mo films, as obtained by AFM. The roughness values were also independently confirmed through cross-sectional TEM, and through high resolution SEM analysis. The films surface roughness decreased steadily as the Mo content increased up to the 32 at. % composition. The surface roughness of the 32 at. % Mo films is extraordinarily small (1 nm) compared to pure sputtered Al (124 nm). At higher composition, (50% Mo), the film is again crystalline, and the RMS roughness quickly increases to nearly 100 nm. The great reduction in surface roughness at the 32 at. % composition is caused by the transition to an amorphous matrix. In crystalline films, surface roughness scales with grain size. Grain size, in turn, depends on deposition temperature, deposition rate, the type and crystallography of the substrate and in the case of van der Drift type of grain growth with the square root of the film thickness [34, 35]. In amorphous films, while there is still a natural surface roughness [36], its actual value is always significantly lower than for the crystalline case.

Resistivity of the Al—Mo films using a standard thin film four-point probe test. The measurement was taken in the form of inner probe voltage divided by current which is proportional to sheet resistance in thin films. FIG. 10D shows the effect of Mo content on the resistivity of the films, with the bulk Al and Mo resistivity values shown for reference [47]. Calculated values were obtained using Landauer's model [48], which has been successfully applied to other equilibrium alloy systems [49]. The resistivity of the pure Al film was slightly higher than that of bulk Al, as expected of a polycrystalline thin film. Reasons for the increase in resistivity with Mo content likely include decreasing grain sizes, increasing defect density, and decreasing degree of crystallinity. The factor that contributes the most is probably the presence of the amorphous phase, as it is well know that amorphous materials are less conductive than crystalline materials due to the dramatically reduced mean free path length. The peak resistivity occurs in the 32 at. % Mo film after which the concentration of crystalline Mo increases.

Example 4

Physical Properties—Ni—Mo

Figure 11:
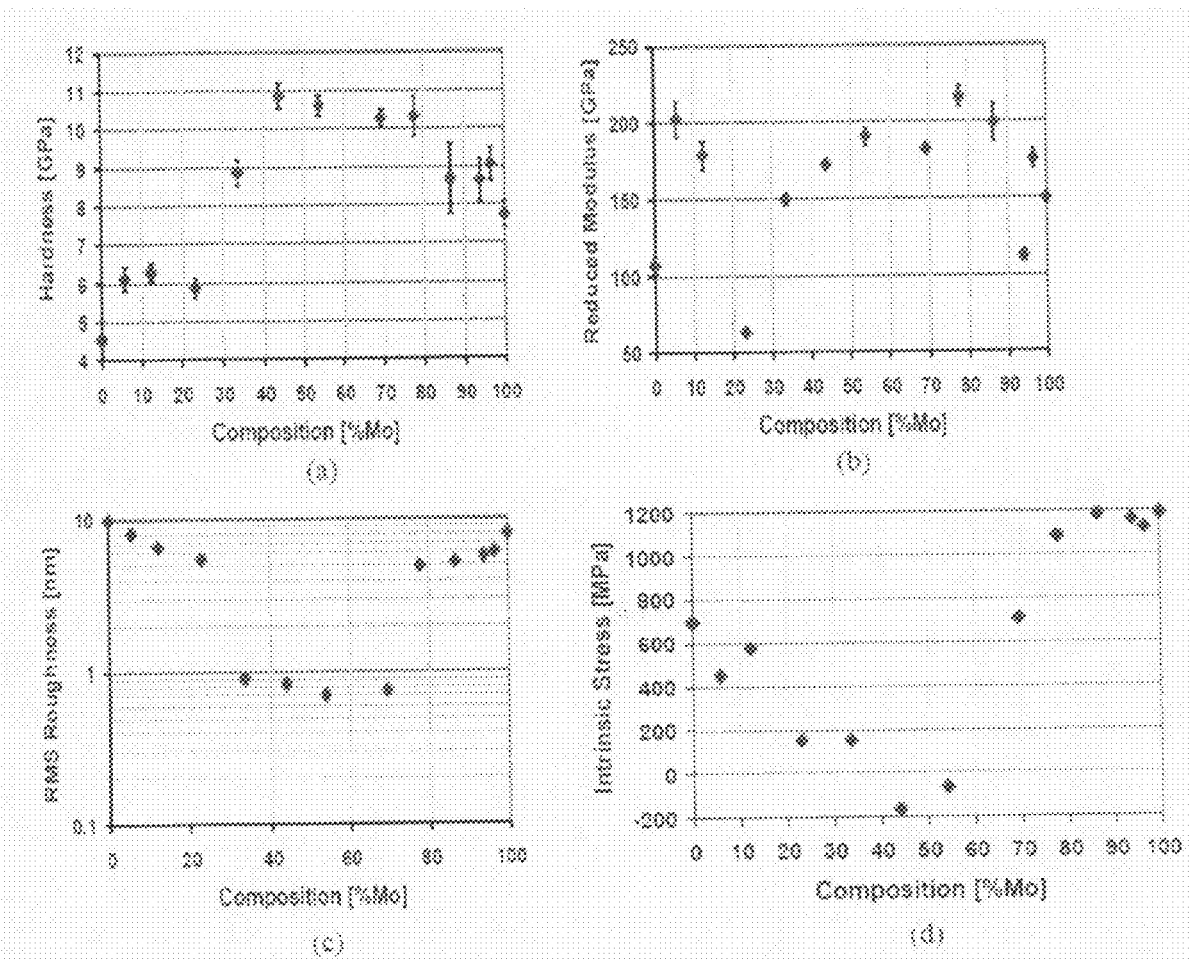
FIG. 11A-D shows the effect of Mo content on physical properties of Ni—Mo films: nanoindentation hardness (A), reduced elastic modulus (B), surface roughness (C) and intrinsic stress (D).

Measured physical properties of Ni—Mo films are shown in FIG. 11 for a range of compositions from pure Ni to pure Mo. FIG. 11A-D shows the nanohardness and reduced modulus from nanoindentation test together with surface roughness and intrinsic stress values. We can see from these results that the nanoindentation hardness for pure Ni and pure Mo is close to what has been reported in the literature[50] and is very high for the middle range of composition (from Ni-34 at. % Mo to Ni-69 at. % Mo) compared to pure Ni and pure Mo (polycrystalline). For the compositions with Mo content below 30 at. % Mo and above 69 at. % Mo, the nanohardness increases which is due to solid solution hardening and Hall-Petch effect (reduced grain size). Modulus is the highest for Ni-78 at. % Mo and falls in the range of 150-200 GPa for the rest of the films having nanocomposite structure, which still is very high for metallic films. The high hardness and modulus for the middle range of composition (34 at. % Mo-69 at. % Mo) may be due to the nanocomposite structure and high hardness of the amorphous phase that is generally higher than that of polycrystalline material for the same material. This is probably due to the absence of dislocations in amorphous phase that makes the plastic deformation and resistance to fracture higher in these materials.

We employed a Hitachi S4800 high-resolution SEM together with a Multimode Digital Instruments Dimension 3100 atomic force microscope (AFM) to examine the surface topography of the films. Depending on grain size, the AFM scan size was in the range of 5 μm×5 μm to 1 μm×1 μm to roughly keep the number of observed grains at different images constant (for better image processing). We used the AFM in contact mode with Budget Sensors aluminum-coated contact mode probes. Then, we processed the AFM data using Scanning Probe Image Processor (SPIP™) commercial software to measure the root mean square (RMS) roughness.

Figure 12:
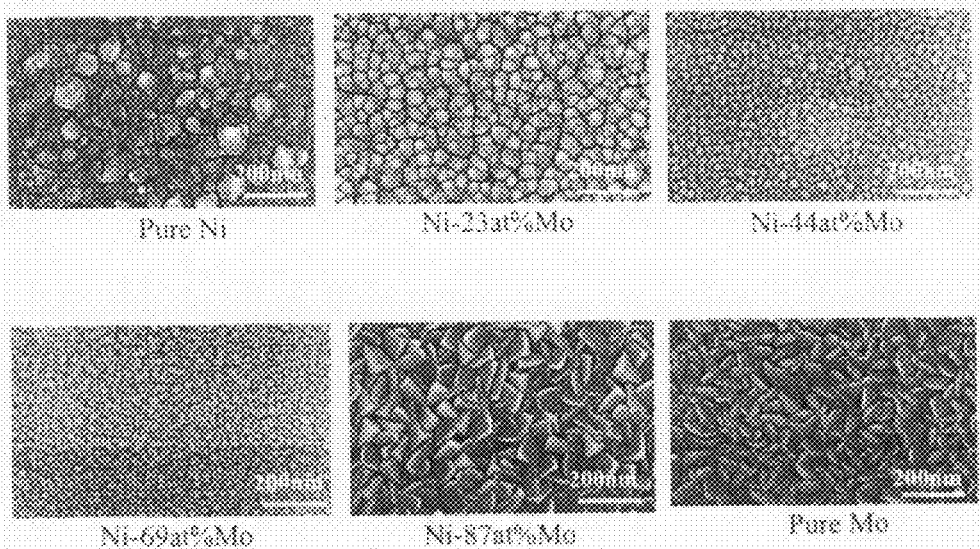
FIG. 12 shows high-resolution SEM images of films ranging from pure Ni, Ni-23 at. % Mo, Ni-44 at. % Mo, Ni-69 at. % Mo, Ni-87 at. % Mo to pure Mo.
Figure 13:
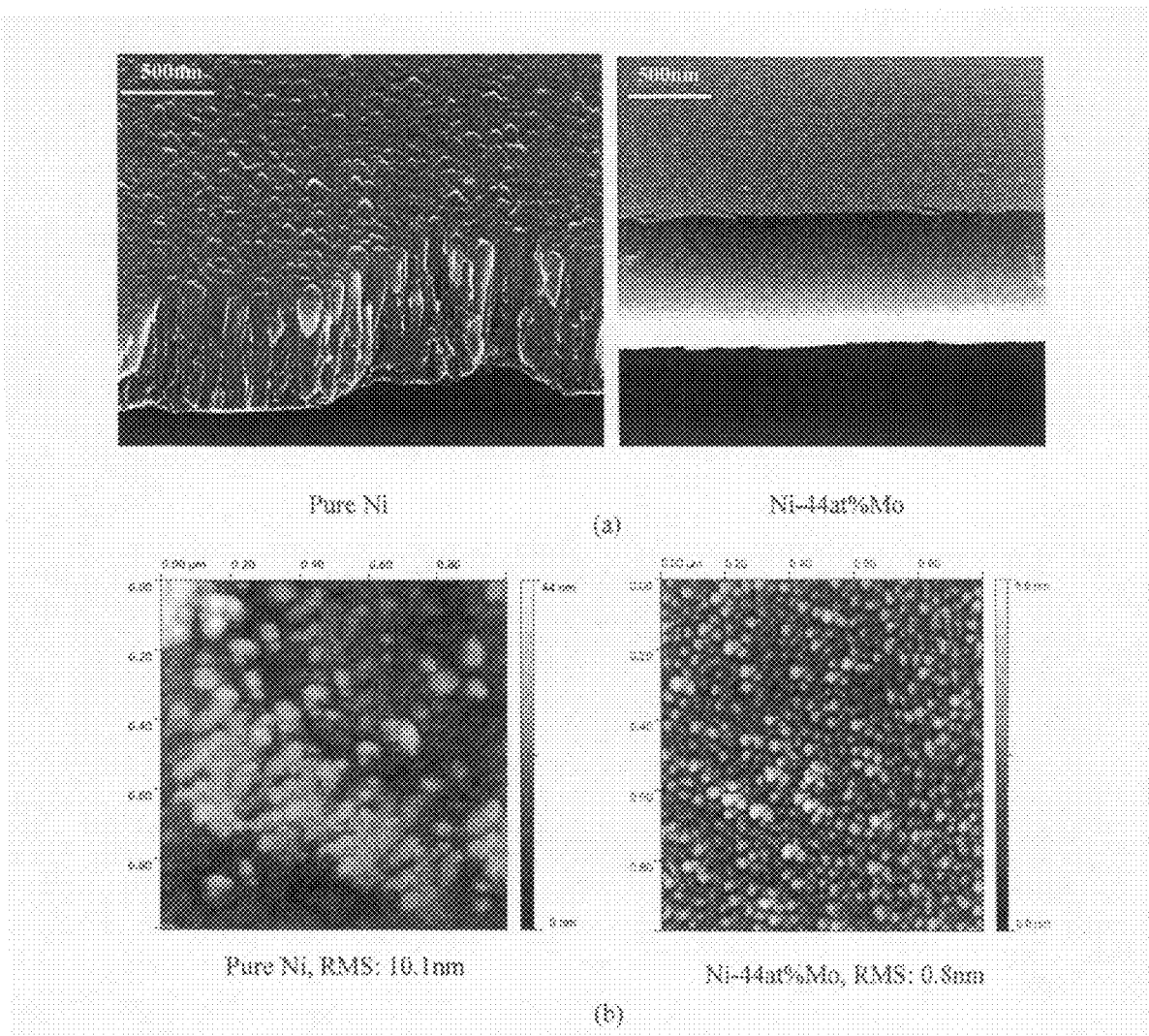
FIGS. 13A and B shows high-angle cross-sectional SEM images of pure Ni and Ni-44 at. % Mo films, and corresponding AFM images with RMS values for comparison purposes, respectively.

FIG. 12 shows the high-resolution SEM images of Ni—Mo films. We can see from this figure that surface of the films is very rough for pure Ni up to around Ni-34 at. % Mo and from pure Mo up to Mo-31 at. % Ni. However, for the middle range of composition (Ni-30 at. % Mo to Ni-70 at. % Mo) the surface of the films looks very smooth. To confirm the smoothness through the thickness, we used high angle SEM to view the cross section of pure Ni and Ni-44 at. % Mo films and the resulting images are shown in FIG. 13A. The image on the left shows the columnar grain growth for pure Ni. In polycrystalline materials such as pure Ni grains grow, in a competitive mode, all the way up to the surface after nucleation on the substrate. The average grain size for pure Ni was measured to be ~115 nm. As the Mo content increases (0 at. %<Mo<23 at. %), the grain size decreases dramatically (~67 nm for Ni-23 at. % Mo) and growth mode is going to be different from pure Ni. The same scenarios discussed for pure Ni and Mo content up to 23 percent could be valid for pure Mo and Mo with the Ni content of up to 22%. The grain size of pure Mo, however, is lower (~83 nm) than that of pure Ni. Also, the addition of Ni to Mo does not reduce its grain size as the surface diffusivity of Ni is higher Mo.

Roughness values are one order of magnitude lower for amorphous-nanocrystalline microstructure than pure Ni and Mo. The RMS decreases with Mo content from 10 nm (for pure Ni) and is the remarkably smooth for the middle range (less than 1 nm). It increases then as a result of crystalline structure and columnar growth to pure Mo (8 nm). For the case of crystalline films, surface roughness scales with grain size, which in turn, depends on rate of deposition, deposition temperature and substrate type. It also scales with square root of thickness for van der Drift type of growth as mentioned before and is the case for the whole range of composition excluding Mo content from 34 at. %-69 at. %. For this range, we will have nanocomposite phase that does not follow the rules of polycrystalline and columnar growth. As seen in the TEM images (FIG. 9), the amorphous-nanocrystalline phases are present through the thickness and no columnar growth was observed.

We measured the stress on the films by means of a KLA Tencor Flexus thin film stress measurement equipment. This piece of equipment works according to the difference in the wafer curvature before and after deposition. The curvature is examined by the reflection of the laser from the surface. We measured the resistivity of the films as well using a standard 4-wire probe measurement technique. The measurement of data was done in the form of inner probe voltage divided by current. This measured data is proportional to the resistance in thin films.

By looking at FIG. 11, it appears that the stress state is very low for the nanocomposite microstructure that could be due to the growth mode in this range, which is not columnar. There are, therefore, almost no stresses developed during the deposition and growth of the film. These results show that if cantilevers are synthesized from Ni—Mo binary alloy, films with compositions in the range of (34 at. %-69 at. %) Mo are preferred, with Ni-44 at. % Mo having the optimum properties, to avoid any deformation resulting from differential stresses in release steps of fabrication and to keep the optimum mechanical properties at the same time.

Figure 14:
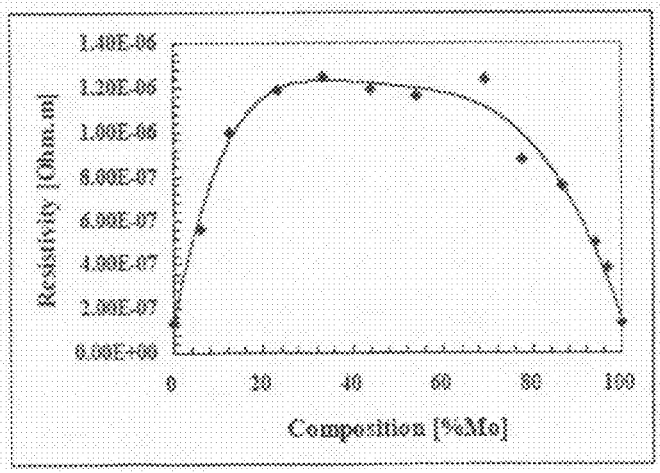
FIG. 14 shows resistivity data for Ni—Mo (the line is only provided to guide the eye).

For nanocomposite range, conductivity is also an order of magnitude lower than that of pure Ni and pure Mo (polycrystalline); however, it is still in the range of metals (FIG. 14). We see that resistivity increases with Mo content as a result of reduced grain size, increased defects amount, and decreased degree of crystallinity. For the middle range, however, we have amorphous phase, which is less conductive as a result of reduced mean free path length compared to crystalline phase.

Example 5

Fabrication of Al—Mo Nanocantilevers

Two thicknesses of Al—Mo cantilever resonators 1-8 μm long and 200-800 nm wide were fabricated using a combination of electron-beam lithography, lift-off, and release by dry etching. PMMA resist approximately 150 nm thick was spun onto a <100> silicon substrate and patterned in a Raith150 lithographic writer using an electron beam of 10 kV with a 10 μm aperture. After development of the resist, a mechanical Al-32 at. % Mo layer was sputtered onto the patterned polymer, and lifted-off by dissolving the unexposed resist in an ultrasonic acetone bath. The structures were then released by etching the silicon in a XeF$_2$ silicon etch. The dry etch release method prevented stiction of the ultra-thin metal cantilevers upon their release.

The thickness of the Al-32 at. % Mo device layers was confirmed by preparing samples sputtered for the same length of time under identical conditions and measuring the deposited layer thickness. Steps were etched from the Al—Mo layer and the thickness was measured using a Zygo white light optical profilometer. The first set of devices had a measured thickness of 20.0±1.4 nm. The measured thickness of the second set was 4.3±0.9 nm.

Figure 15:
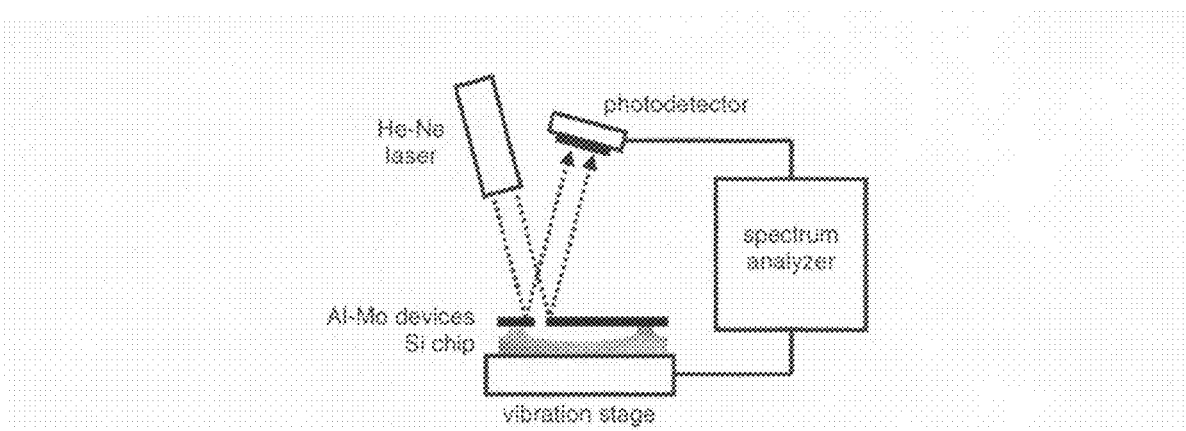
FIG. 15 shows a schematic of the setup used to measure the resonance properties of nanoscale cantilevers.

Preliminary mechanical assaying was performed using an interferometric method originally developed for the characterization of surface machined silicon NEMS resonators [3], shown schematically in FIG. 15. The chip is mounted onto a small piezoelectric element, which is inserted in a small vacuum chamber pumped down to the $10^{-4}$ Torr range. The piezoelectric element is then actuated by the tracking output of a Hewlett Packard ESA-L1500A spectrum analyzer amplified by an ENI UA-400A power amplifier. A He—Ne laser (λ=633 nm) is focused onto the cantilever device using a 0.35 NA microscope objective. When actuated at resonance, relative motion of the cantilever with respect to coplanar objects modulates the reflected signal. The modulated signal is reflected back through the microscope objective. A beam splitter is then employed to divert the reflected signal towards a New Focus 1601 AC coupled photodetector, whose output is fed to the input of the spectrum analyzer.

The resonance response was obtained on Al-32 at. % Mo cantilevers using a previously reported optical method [3] The response of a thin cantilever of rectangular cross section is given by:

$$f_0 = \frac{t}{2\pi(0.98)L^2}\left(\frac{E}{\rho}\right)^{\frac{1}{2}} \tag{1}$$

Figure 17:
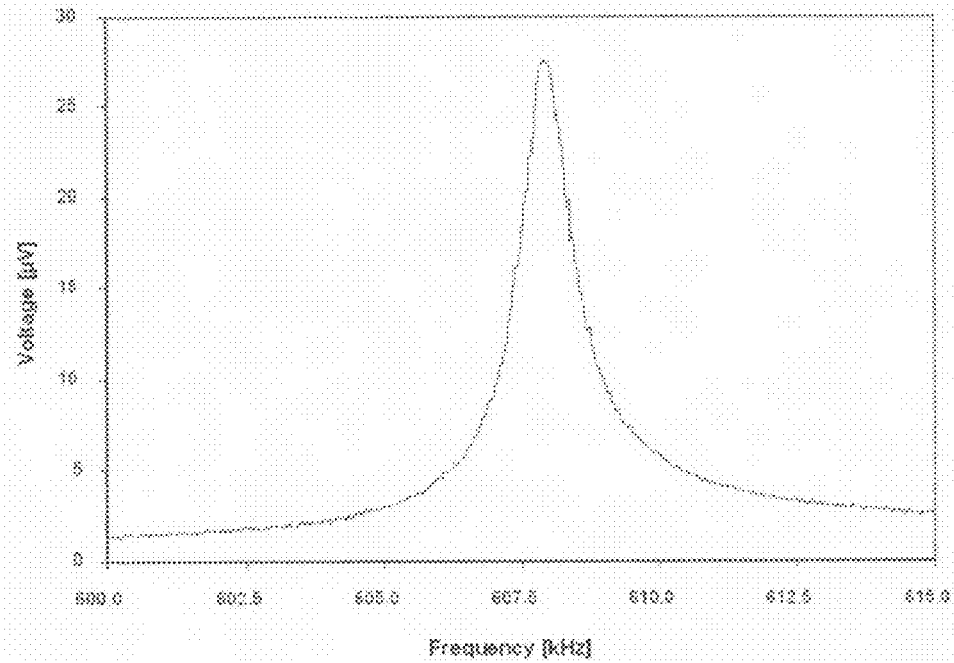
FIG. 17 shows the resonance response of a single-anchored Al—Mo cantilever having a length of 5 μm, width of 800 nm, and a thickness of 20 nm.

The typical response of width w=800 nm, length L=5 μm, and thickness t=20 nm cantilever is shown in FIG. 17. The resonance is centered at $f_0$=608 kHz, and the resonance quality Q=482, as measured from the width of the response. Such response suggests a $(E/\rho)^{0.5}$=4680 m/s. Assuming a rule of mixtures, we calculate a density of $\rho$=5130 kg/m$^3$ for these films. This suggests a Young's modulus of E=112 GPa for the cantilevers, in good agreement with the nanoindentation analysis presented above which gave a reduced modulus of 138 GPa for the Al-32 at. % Mo films.

Example 6

Ni—Mo Nanocantilevers

We fabricated single-clamped cantilevers having a thickness of 50 nm at widths of 400 nm and 800 nm with different lengths from 1 μm to 6 μm using the following nano-fabrication process. A silicon prime wafer was obtained for the structural base for the cantilevers. We cleaned the wafer in a hot piranha solution, then rinsed with de-ionized water and cleaned in a spin-rinse dryer. A 400 nm layer of SiO$_2$ was grown on the wafer by wet oxidation. We cleaved the oxidized wafer into small dies for use in the E-beam lithography system. Then, we span a layer of PMMA 495 onto the dies and baked it on the hotplate. A layer of PMMA 950 was spun onto the dies as well and was baked on the hotplate for 30 minutes at 235° C. We patterned the resist then with the RAITH150 electron beam lithography system using standard settings. We developed the resist in a solution of one part methyl isobutyl ketone (MIBK) and three parts of isopropyl alcohol (IPA), then immersed it in an etch stop solution of IPA and rinsed it in a beaker of de-ionized (DI) water. The developed die was then subjected to a plasma to etch the first few nanometers of the resist surface. An reactive ion etching (RIE) system was pumped down and the die was subjected to an O$_2$ plasma. We mounted the die in a magnetron sputter system to deposit the Ni—Mo device layer (50 nm thick). Then, we immersed the die in a buffered oxide etching (BOE) solution in order to release the cantilever devices, then rinsed it in two different water baths before being immersed in an IPA beaker for transfer to the critical point dryer. We dried the dies then in a critical point drying machine. We used the Ni—Mo cantilevers then for SEM imaging and resonance testing.

After fabrication, we took high-angle images from cantilevers using the high-resolution SEM to make sure that the cantilevers are fully-released, clean and not deformed as a result of stresses. Also, we did resonance test on the released cantilevers (800 nm wide ones only) using the interferometric method described above.

Figure 18:
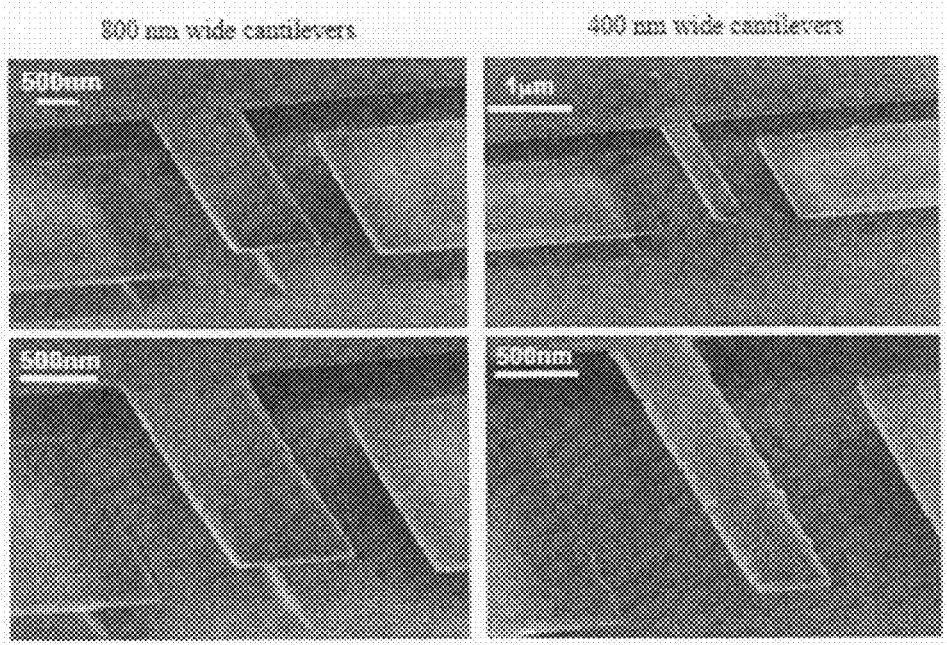
FIG. 18 shows high-angle SEM images of a 50 nm thick Ni-44 at. % Mo cantilevers at 400 nm and 800 nm wide.
Figure 19:
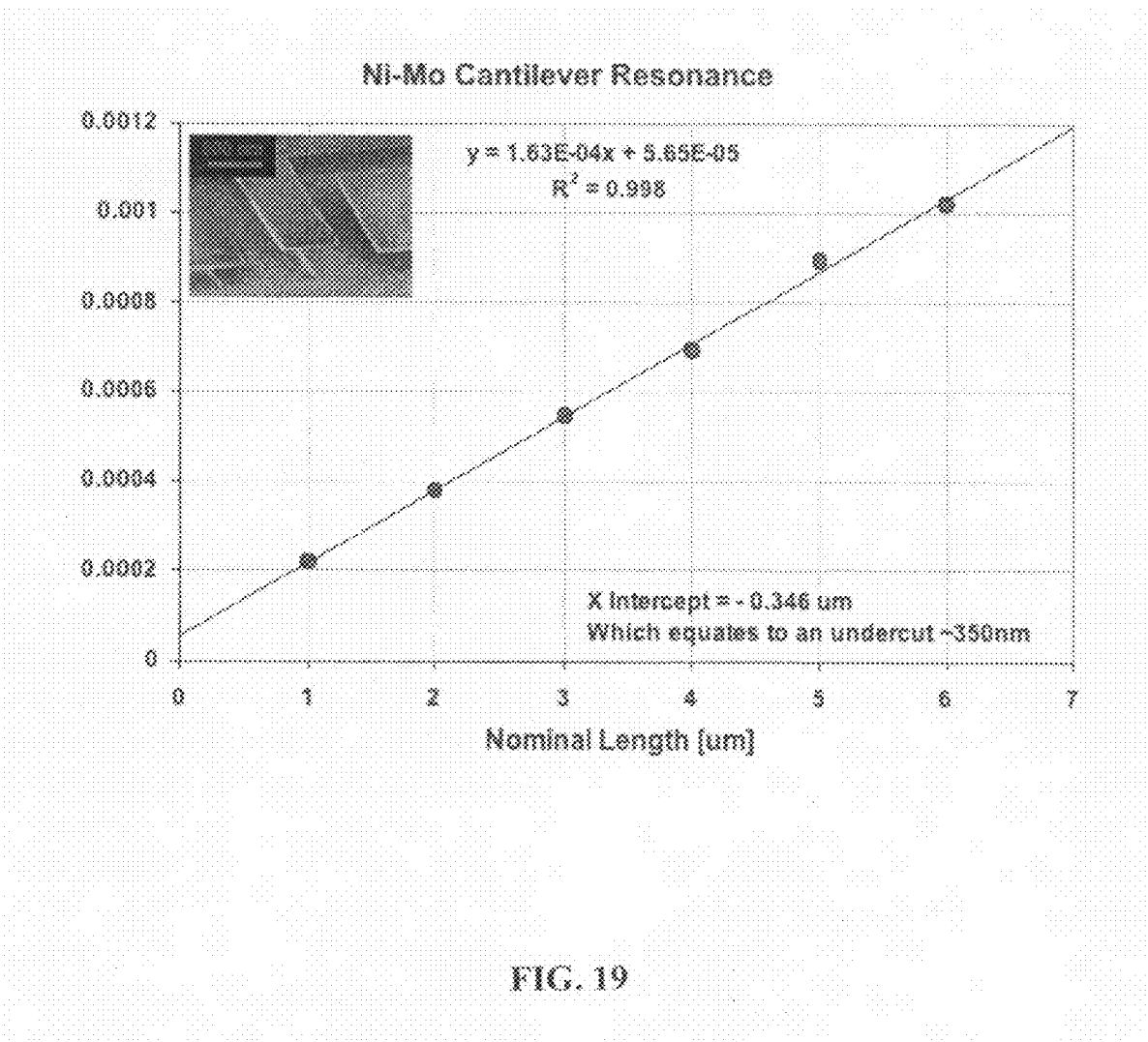
FIG. 19 shows resonance properties of varying lengths of a Ni-44 at. % Mo cantilever which is 50 nm thick and 800 nm wide.

Images of the formed cantilevers are shown in FIG. 18. It appears that there is almost no deformation in the cantilevers and their surfaces are very smooth, as expected. The resonance properties of 800 nm wide cantilevers are shown in FIG. 19 for different lengths. The resonance frequency can be expressed according to equation (1) above. The frequency for a 50 nm thick, 800 nm wide and 4 µm long cantilever was measured to be 20820 kHz. We calculated the Young's modulus of 225 GPa from Eq. (1) that is close to the reduced modulus of 172 GPa measured from nanoindentation for Ni-44 at. % Mo. We used the rule of mixture to calculate the density. From FIG. 19, we can see that a line can be well fitted to the data the intercept of which, shows an undercut of ~350 nm for the cantilevers.

REFERENCES

The following references are referred to above and are incorporated herein by reference as if reproduced in their entirety.

1. Roukes M L 2001 *Phys. World.* 14 25
2. Clealand A N and Roukes M L 1996 *Appl. Phys. Lett.* 69 2653
3. Carr D W, Evoy S, Sekaric L, Craighead H G and Parpia J M 1999 *Appl. Phys. Lett* 75 920
4. Sekaric L, Carr D W, Evoy S, Parpia J M and Craighead H G 2002 *Sensors and Actuators* A 101 215
5. Fu Y, Du H, Huang W, Shang S and Hu M 2004 *Sensors and Actuators* 11 395
6. Ekinci K L and Roukes M L 2005 *Rev. Sci. Instruments* 76 061101
7. Mehregany M, Zorman C A, Rajan N and Wu C H 1998 *Proc. IEEE* 86 1594
8. Romig A D Jr, Dugger M T and McWhorter P J 2003 *Acta Mater.* 51 5837
9. The W H, Luo J K, Graham M R, Pavlov A and Smith C G 2003 *J. Miromech. Microeng,* 13 591
10. Huang X M H, Manolidis M, Jun S Ch and Hone J 2005 *Appl. Phys. Lett* 86 143104
11. Sahara R and Nix W D 2002 *Acta Mater.* 50 23
12. Harper J M E and Rodbell K P 1997 *J. Vac. Sci. Tech. B* 15 763
13. Sasaki H, Kita K, Nogahora J and Inoue A 2001 *Materials Transactions* 42 1561
14. Somekawa H, Tanaka T, Sasaki H, Kita K, Inoue A and Higashi K 2004 *Acta Mater.* 52 1051
15. Mukai T, Suresh S, Kita K, Sasaki H, Kobayashi N, Higashi K and Inoue A 2003 *Acta Mater.* 51 4197
16. Habazaki H, Takahiro T, Yamaguchi S, Hashimoto K, Dabek J, Mrowec S and Danielwski M 1994 *Mater. Sci. Eng.* A 181/182 1099
17. Massalski T B ed. 1990 *Binary Phase Diagrams* Vol 1 (Materials Park, Ohio: ASM International) 173
18. Habazaki H, Shimizu K, Skelton P, Thompson G E, Wood G C and Zhuo X 1997 *Corrosion Science* 39 731
19. Crossland A C, Thompson G E, Wan J, Habazaki H, Shimizu K, Skeldon P and Wood G C 1997 *J. Electrochem. Soc.* 144 847
20. Janik-Czachor M, Jaskiewicz A, Dolata M and Werner Z 2005 *Mat. Chem. Phys.* 92 348
21. Habazaki H, Skelton P, Shimizu K, Thompson G E and Wood G C 1995 *Corrosion Science* 37 1497
22. Habazaki H, Takohiro K, Yamaguchi S, Hashimoto K, Dabek J, Mrowec S and Danielewski M 1994 *Mater. Sci. Eng.* A 181/182 1099
23. Wolowik W and Janik-Czachor M 1999 *Mater. Sci. Eng.* A 267 301
24. Zdujic M, Poleti D, Karanovic L, Kobayashi K F and Shingu P H 1994 *Mater. Sci. Eng.* A 185 77
25. Monagheddu M, Delogu F, Schffini L, Frattini R and Enzo S 1999 *NanoStructured Mat.* 11 1253
26. Colgan E G and Mayer J W 1989 *J. Mater. Res.* 4 815
27. Bates R I and Abu-Zeid O A 1996 *Vacuum* 47 107
28. W. Zhang, X. S. Zhang, D. H. Yang and Q. J. Xue, "Sliding wear study of ion-beam mixing Ni—Mo multilayer films on steel", *Wear* 197 (1996) 228-232.
29. F. R. de Boer, R. Boom, W. C. M. Mattens and A. R. Miedema, *Cohesion in Metals—Transition Metal Alloys*, Elsevier Scientific Pub. Co., New York, USA, 1988.
30. A. R. Miedema, F. de Ch.~Tel and F. R. de Boer, "Cohesion in alloys-fundamentals of a semi-empirical model", *Physica B* 100 (1980) 1-28.
31. Cantor B and Cahn R W 1976 *Acta Metallurgica* 24 845
32. Cantor B and Cahn R W 1976 *J. Mater. Sci.* 11 1066
33. Wang S Z, Shao G, Tsakiropoulos P and Wang F 2002 *Mater. Sci. Eng.* A 239 141
34. Smereka P, Li X, Russo G and Srolovitz D J 2005 *Acta Mater.* 53 1191
35. Thompson C V 2000 *Ann. Rev. Mater. Sci.* 30 159
36. Bales G S and Zangwill A 1991 *J. Vac. Sci. Technol.* A 9 145
37. G. S. Bales, A. ZangwillZANGWILL, "Macroscopic model for columnar growth of amorphous films by sputter deposition", *J. Vac. Sci. Technol.* A 9: (1991) 145-149.
38. H. P. Klug and L. E. Alexander, *X-ray Diffraction Procedures for Polycrystalline and Amorphous Materials*, John Wiley & Sons, New York, USA, $2^{nd}$ Edition, 1974.
39. T. B. Massalski T B (ed), *Binary Alloy Phase Diagrams*, Vol 2, ASM International, Materials Park, Ohio, $2^{nd}$ Edition, 1990.
40. R. A. Mirshams and P. Parakala, "*Nanoindentation of nanocrystalline Ni with geometrically different indenters*', *Mater. Sci. Eng.* A 372 (2004) 252-260.
41. B. Zhao, F. Zeng and F. Pan, "Formation of metastable alloy film in the Ni—Mo binary system by ion-beam-assisted deposition", *Appl. Phys. A* 77 (2003) 523-528.
42. B. Cantor and R. W. Cahn, 'Metastable alloy phases by co-sputtering', *Acta Metall.* 24 (1976) 845-852.
43. Oliver W C and Pharr G M 2004 *J. Mater. Res.* 19 3
44. Farhat Z N, Ding Y, Northwood D O and Alpas A T 1996 *Mater. Sci. Eng.* A 206 302
45. Yoder K B, Elmustafa A A, Lin J C, Hoffman R A and Stone D S 2003 *J. Phys. D: Appl. Phys.* 36 884
46. Petersen K 1982 *IEEE Proc.* 70 420
47. Kaye G W C and Laby T H 1993 *Tables of physical and chemical constants* 15th edition (London, UK: Longman)
48. Landauer R 1952 *J. Appl. Phys.* 23 779
49. Rowlands J A, Stackhouse B J and Woods S B 1978 *J. Phys. F: Metal Phys.* 8 2545
50. K. B. Yoder, A. A. Elmustafa, J. C. Lin, R. A. Hoffman and D. S. Stone, "*Activation analysis of deformation in evaporated molybdenum thin films*

What is claimed is:

1. A binary nanocomposite film consisting essentially of body centered cubic nanocrystal molybdenum dispersed in an amorphous metallic matrix of aluminum or nickel.

2. The nanocomposite film of claim 1 wherein the amorphous metallic matrix consists essentially of aluminum.

3. The nanocomposite film of claim 2 which comprises between about 8 at. % Mo to about 50 at. % Mo.

4. The nanocomposite film of claim 3 which comprises about 32 at. % Mo.

5. The nanocomposite film of claim 1 wherein the amorphous metallic matrix consists essentially of nickel.

6. The nanocomposite film of claim 5 which comprises between about 23 at. % Mo and about 69% Mo.

7. The nanocomposite film of claim 6 which comprises about 44 at. % Mo.

8. The nanocomposite film of claim 1 wherein the nanoindentation hardness of the film is greater than about 3.5 GPa.

9. A method of forming a nanoscale cantilever fabricated from a nanocomposite film as claimed in claim 1, comprising the steps of:

(a) patterning a resist;
(b) developing the resist;
(c) etching the resist;
(d) depositing the nanocomposite film and releasing the resulting cantilever.

10. A nanoscale cantilever fabricated from a nanocomposite film as claimed in claim 1.

11. The nanoscale cantilever of claim 10 which is greater than about 1 μm long and less than about 800 nm wide.

12. The nanoscale cantilever of claim 10 which is less than about 50 nm thick.

13. The nanoscale cantilever of claim 12 which is less than about 20 nm thick.

14. A method of forming a binary nanocomposite film consisting essentially of body centered cubic nanocrystal molybdenum dispersed in an amorphous metallic matrix of aluminum or nickel, comprising the step of co-depositing the Mo and the Al or Ni in the form of a thin film.

15. The method of claim 14 where the co-depositing step comprise co-sputtering.

* * * * *